United States Patent
Awaya et al.

(10) Patent No.: US 8,445,881 B2
(45) Date of Patent: May 21, 2013

(54) NONVOLATILE VARIABLE RESISTIVE ELEMENT AND NONVOLATILE SEMICONDUCTOR MEMORY DEVICE

(75) Inventors: Nobuyoshi Awaya, Osaka (JP); Yukio Tamai, Osaka (JP); Akihito Sawa, Tsukuba (JP)

(73) Assignees: Sharp Kabushiki Kaisha, Osaka (JP); National Institute of Advanced Industrial Science and Technology, Tokyo (JP)

( * ) Notice: Subject to any disclaimer, the term of this patent is extended or adjusted under 35 U.S.C. 154(b) by 211 days.

(21) Appl. No.: 13/093,171

(22) Filed: Apr. 25, 2011

(65) Prior Publication Data
US 2012/0268980 A1 Oct. 25, 2012

(30) Foreign Application Priority Data
Apr. 23, 2011 (JP) ................................. 2010-099688

(51) Int. Cl.
*H01L 29/02* (2006.01)
(52) U.S. Cl.
USPC ..... 257/2; 257/3; 257/4; 257/5; 257/E29.002; 438/102; 438/103; 438/104
(58) Field of Classification Search
USPC .... 257/2–5, E29.002; 438/102–104; 365/163
See application file for complete search history.

(56) References Cited

U.S. PATENT DOCUMENTS

| 2003/0142578 A1 | 7/2003 | Hsu et al. |
| 2004/0036109 A1 | 2/2004 | Inoue et al. |
| 2006/0081962 A1 | 4/2006 | Wei et al. |
| 2009/0218565 A1* | 9/2009 | Kawano et al. ................. 257/43 |

FOREIGN PATENT DOCUMENTS

| JP | 2003-68984 | 3/2003 |
| JP | 2004-87069 | 3/2004 |
| JP | 2006-120702 | 5/2006 |
| JP | 2006-155846 | 6/2006 |
| JP | 2007-317874 | 12/2007 |

OTHER PUBLICATIONS

Sawa, "Resistive switching in transition metal oxides", *Material Today*, vol. 11, No. 6, p. 28-36, 2008.

* cited by examiner

*Primary Examiner* — Jami M Valentine
(74) *Attorney, Agent, or Firm* — Nixon & Vanderhye, P.C.

(57) ABSTRACT

A large-capacity and inexpensive nonvolatile semiconductor memory device that prevents a leak current and is operated at high speed is implemented with a nonvolatile variable resistive element. A memory cell array includes the nonvolatile variable resistive elements each including a variable resistor composed of a metal oxide film to cause a resistance change according to an oxygen concentration in the film, an insulation film formed on the variable resistor, first and second electrodes to sandwich the variable resistor, and a third electrode opposite to the variable resistor across the insulation film. A writing operation is performed by applying a voltage to the third electrode to induce an electric field having a threshold value or more, in a direction perpendicular to an interface between the variable resistor and the insulation film, and a resistance state of the variable resistor is read by applying a voltage between the first and second electrodes.

21 Claims, 31 Drawing Sheets

VB $Pr_{0.5}Ca_{0.5}MnO_3$

VB $Pr_{0.5}Ca_{0.5}MnO_{3-\delta}$

Ti $TiO_x$ $V_O$

Reduced $Pr_{0.5}Ca_{0.5}MnO_{3-\delta}$

CB

~ 0.25 eV $E_F$

VB $Pr_{0.5}Ca_{0.5}MnO_3$

Set / Reset

Ti $TiO_x$ $V_O$

CB

~ 0.25 eV $E_F$

VB $Pr_{0.5}Ca_{0.5}MnO_3$

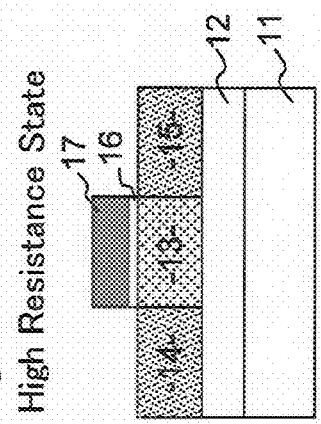
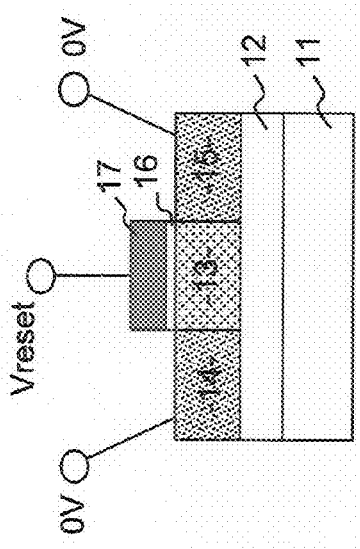
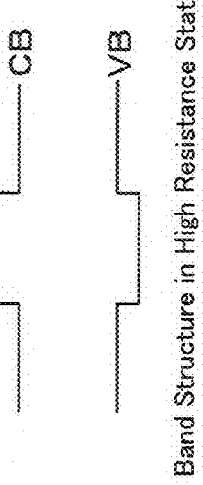
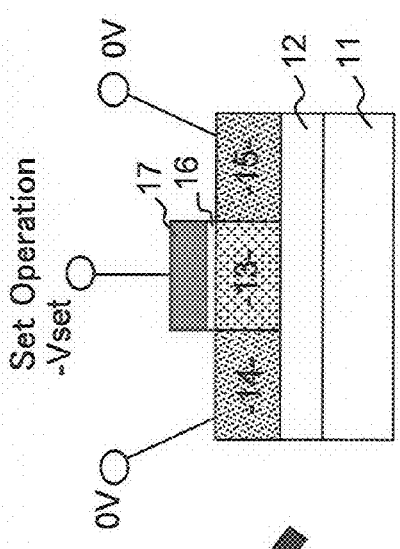
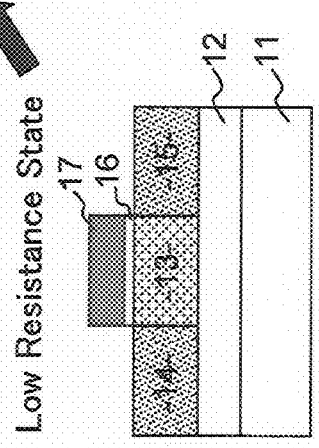

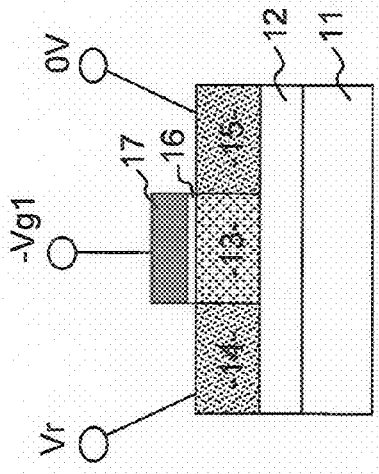
Fig. 4A
Band Structure in Low Resistance State
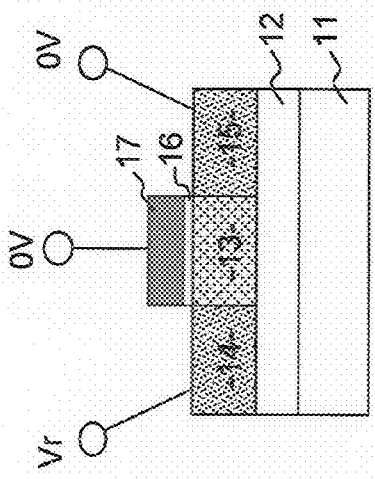
Fig. 4B
Band Structure in High Resistance State
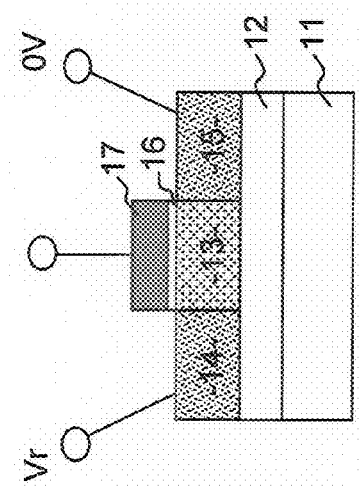
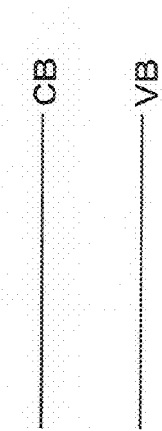
Fig. 4C
Band Structure when Negative Bias is applied in High Resistance State Reset Operation Reading in Low Resistance State Band Structure in Low Resistance State Reading in High Resistance State Band Structure when Negative Bias is applied in High Resistance State A-A' Cross-sectional Surface B-B' Cross-sectional Surface C-C' Cross-sectional Surface

NONVOLATILE VARIABLE RESISTIVE ELEMENT AND NONVOLATILE SEMICONDUCTOR MEMORY DEVICE

CROSS REFERENCE TO RELATED APPLICATION

This Nonprovisional application claims priority under 35 U.S.C. §119(a) on Patent Application No. 2010-099688 filed in Japan on Apr. 23, 2010 the entire contents of which are hereby incorporated by reference.

1. Field of the Invention

The present invention relates to a semiconductor memory device and more particularly to a nonvolatile semiconductor memory device including a nonvolatile variable resistive element having a first terminal, a second terminal, and a variable resistor formed on a current path between the terminals, and capable of reversibly changing a resistance state defined by electric resistance between the terminals, between two or more different states in response to an applied voltage and holding it.

2. Description of the Related Art

In tandem with the penetration of a mobile device such as a portable electric device, a flash memory has been widely used as a large-capacity and inexpensive nonvolatile memory which can hold stored data even when it is powered off. However, recently it has been found that the flash memory is limited in its miniaturization, so that nonvolatile memories such as a MRAM (Magnetoresistive Random Access Memory), a PCRAM (Phase Change Random Access Memory), a CBRAM (Conductive Bridging Random Access Memory), and a RRAM (Resistive Random Access Memory: Refer to A. Sawa, "Resistive switching in transition metal oxides", Material Today, Vol. 11, No. 6, p. 28-36 (2008) which is hereinafter referred to as the non-patent document) are increasingly being developed. Among these nonvolatile memories, the RRAM is a resistance change type nonvolatile memory using a change in deficient oxygen in a metal oxide, and it can implement a large resistance change and high-speed writing with a simple memory structure, so that it offers promising prospects as a highly integratable memory.

A unit element of the RRAM is composed of a two-terminal variable resistive element (resistance change element) in which a metal oxide film is sandwiched by two electrodes. Regarding the memory using the two-terminal variable resistive element, a cell structure and a memory array structure each having a simplest structure and suitable for increasing capacity are implemented in a cross point memory having a 1R structure in which a unit memory cell is only formed of a variable resistive element, as shown in Japanese Unexamined Patent Publication No. 2003-068984 (hereinafter, referred to as the patent document 1). This structure can be provided in the RRAM having a large resistance change rate, but it is necessary to take measures against a leak current.

In order to eliminate the leak current in the 1R structure (having a variable resistive element only), a circuit is provided to prevent a voltage applied to the variable resistive element from fluctuating in view of load resistance on the side of a decoder when the voltage is applied to the variable resistive element according to Japanese Unexamined Patent Publication No. 2006-155846 (hereinafter, referred to as the patent document 2). This is provided to take measures against the leak current in the 1R structure which is generated because the load resistance on the decoder side is not negligible as compared with resistance of the variable resistive element. That is, an externally applied voltage is divided based on a ratio between the resistance of the variable resistive element and the load resistance on the decoder side, so that a potential difference is generated between wirings connected to the variable resistive element in a memory cell array, based on a resistance value of the variable resistive element, which causes the leak current. In the configuration shown in the patent document 2, the potential fluctuation between the wirings is prevented and the leak current is prevented by providing the circuit to detect the potential fluctuation between the wirings and to keep the voltage applied to the variable resistive element constant.

However, the leak current can be prevented to a certain degree by this method, but in order to effectively prevent the leak current, it is necessary to reduce the number of the elements to the relatively small number in the memory cell array, so that area occupied by the decoder increases, and a memory chip size cannot be reduced.

Thus, to avoid the problem of the leak current, a cell structure called a 1T1R or 1D1R in which a current limit element such as a transistor or a two-terminal rectifying element (diode or varistor) is added to the unit memory cell has been developed as disclosed in Japanese Unexamined Patent Publication No. 2004-087069. The 1T1R structure can control an amount and a direction of a current flowing in the variable resistive element in a 1R part and it is superior in controllability, but it is large in area and a multilayer structure cannot be easily provided, so that its memory capacity is limited by a chip area and a design rule.

Meanwhile, the 1D1R structure is provided such that a minimum area unit element is formed in a cross point structure by optimizing the process, and multilayer structure can be provided, so that it is suitable for increasing capacity. The memory cell using the 1D1R structure can be combined with the matrix-shaped array structure as shown in the patent document 1. However, to form the unit memory cell by connecting the variable resistive element and the two-terminal rectifying element in series, it is necessary to laminate a pn junction or Shottky junction and the variable resistive element, so that steps become complicated and it is difficult to optimize characteristic balance between the variable resistive element and the rectifying element to obtain a preferable memory operation.

As described above, although the cross point large-capacity nonvolatile memory can be composed with the variable resistive element, a choice has to be made whether the circuit is used, or the complicated production steps are employed by combining the current limit element such as a diode, to prevent the leak current instead of using the simple 1R structure.

Furthermore, the programming, erasing, and reading of the variable resistive element are performed by applying a voltage between the two terminals of the variable resistive element. In the case of a nondestructive readout nonvolatile memory, the voltage applied at the time of reading has to be sufficiently lower than the voltage applied at the time of programming and erasing.

Meanwhile, in the case where a large amount of information is programmed or erased in the nonvolatile memory at high speed, the plurality of memory cells are required to be programmed or erased at the same time. Thus, programming and erasing currents per memory cell need to be sufficiently small. However, when the programming and erasing currents are small, the reading current becomes extremely small for the above reason, so that it takes time for the reading operation. As a result, the operation cannot be performed at high speed.

It is an object of the present invention to solve the above problem, and to provide a nonvolatile variable resistive element capable of performing a reading operation by a low reading voltage, reducing a cell area, and being easily produced, and a large-capacity and inexpensive nonvolatile semiconductor memory device using the nonvolatile variable resistive element and capable of preventing a leak current and being operated at high speed.

SUMMARY OF THE INVENTION

According to the present invention, a nonvolatile variable resistive element used in a memory cell having a cross point structure has a three-terminal or four-terminal structure instead of a conventional two-terminal structure, thereby enabling the variable resistive element to implement high integration with a simple configuration, and thus, enabling a large-capacity and inexpensive nonvolatile semiconductor memory device to prevent a leak current.

Hereinafter, a description will be made in detail of a material property which serves as a premise of the present invention.

While the resistance change element (variable resistive element) called the RRAM changes its resistance depending on a concentration of deficit oxide in a metal oxide film serving as a variable resistor in general, as shown in the non-patent document, it is classified to the one in which the resistance change is generated in a metal oxide having a perovskite structure represented by $Pr_{1-X}Ca_XMnO_3$ (PCMO) when oxygen moves through an interface between the metal oxide and an electrode, and an oxygen concentration uniformly changes in the whole electrode interface, and the one in which the resistance change is generated mainly in a binary oxide of transition metal when deficit is generated in a part of the metal oxide in the form of a filament. The present invention uses the former resistance change material as a variable resistor in which the oxygen concentration uniformly changes in the whole electrode interface, and the resistance change is generated. The resistance change material includes a Ti or Mn oxide film having the perovskite structure such as $SrTiO_3$, the above PCMO, or $Sm_{1-X}Ca_XMnO_3$.

FIG. 1 shows a principle of the resistance change of $Pr_{1-X}Ca_XMnO_3$ (PCMO) as an example. The material PCMO is a p type material which shows electric conduction by holes, and as shown in FIGS. 1A and 1B, when the oxygen concentration is lower than a stoichiometric composition, a bandgap increases and electric resistance increases. In addition, when metal having strong electron affinity such as Ti or Al is provided as one electrode, oxygen moves from PCMO to the metal, a metal oxide layer is formed around the interface between the metal and the PCMO on the side of the metal, and a layer having a low oxygen concentration due to an increase of deficit oxygen Vo is formed around the interface on the side of the PCMO. Here, when a positive or negative electric field is applied, as shown in FIGS. 1C and 1D, oxygen (deficit oxygen) moves between the PCMO and the metal oxide layer depending on the direction of the electric field, and it is considered that the resistance changes due to a change in band structure of the PCMO.

As a first characteristic, a nonvolatile variable resistive element according to the present invention made to attain the above object has a variable resistor composed of a metal oxide film to cause a resistance change according to an oxygen concentration in the metal oxide film, and an insulation film formed on the variable resistor, a first electrode and a second electrode having contact with the variable resistor and being apart from each other in a direction parallel to an interface between the insulation film and the variable resistor, and a third electrode being opposite to the variable resistor in a direction perpendicular to the interface across the insulation film, over a path of a current flowing between the first and second electrodes through the variable resistor, wherein oxygen is reversibly moved between the variable resistor and the insulation film through the interface by an electric field having an element in the direction perpendicular to the interface when a voltage is applied to the third electrode, and a resistance characteristic of the variable resistor transits between two or more different resistance states and the one resistance state after the transition is held in a nonvolatile manner, a current flows between the first and second electrodes based on the resistance characteristic according to the resistance state of the variable resistor when a voltage is applied between the first and second electrodes, and the resistance characteristic according to the resistance state of the variable resistor held in the nonvolatile manner is temporarily lowered in resistance when the voltage is applied between the first and second electrodes under the condition that the voltage is applied to the third electrode.

Based on the above material property knowledge, the nonvolatile variable resistive element according to the present invention is composed of the first electrode, the second electrode, and the variable resistor having contact with the first and second electrodes, and the variable resistor is composed of the metal oxide film to cause the resistance change due to the increase and decrease in oxygen concentration in the film. Furthermore, since the metal oxide film serving as the variable resistor is in contact with the third electrode with the insulation film interposed therebetween, the nonvolatile variable resistive element according to the present invention has the same structure as a field-effect transistor because it has a channel region formed in the metal oxide film on the side of the interface between the metal oxide film opposite to the third electrode across the insulation film, and the insulation film, and a source region and a drain region to sandwich the channel region.

Thus, when a voltage is applied to the third electrode, the nonvolatile variable resistive element of the present invention controls the electric field provided perpendicular to the interface between the metal oxide film and the insulation film, moves oxygen between the metal oxide film and the insulation film, increases and decreases the oxygen concentration in the metal oxide film of the channel region and changes the resistance state of the metal oxide film. Meanwhile, when a voltage is applied between the source and the drain through the first and second electrodes, a current flowing parallel to the interface through the metal oxide film of the channel region is detected, and the resistance state of the metal oxide film is detected.

As described above, in the case of the nonvolatile variable resistive element according to the first characteristic, since a current path of the current flowing at the time of writing (programming and erasing) of the resistance state is different from that of the current flowing at the time of detecting (reading) of the resistance state, the decrease in current at the time of writing and the ensuring of the reading current having a certain level or more can be implemented at the same time.

In addition, when a voltage is also applied to the third electrode, the resistance characteristic according to the resistance state of the variable resistor can be temporarily modulated toward the low resistance side by the electric field perpendicular to the interface between the metal oxide film and the insulation film. Thus, the large reading current can be obtained even by a low reading voltage.

In addition to the first characteristic, as a second characteristic, in the nonvolatile variable resistive element according to the present invention, the first and second electrodes are composed of the same metal oxide film as that of the variable resistor, and oxygen concentrations thereof are fixed to an oxygen concentration at which the resistance characteristic is in a lowest resistance state among the resistance states of the variable resistor.

In the case of the nonvolatile variable resistive element according to the second characteristic, since the first electrode, the second electrode, and the variable resistor are made of the same metal oxide film, the nonvolatile variable resistive element can be easily produced.

In addition to the first or second characteristic, as a third characteristic, in the nonvolatile variable resistive element according to the present invention, a change in resistance characteristic of the variable resistor due to the movement of oxygen between the variable resistor and the insulation film through the interface is generated in an entire film thickness of the variable resistor in a direction perpendicular to the interface.

In the case of the nonvolatile variable resistive element according to the third characteristic, when a film thickness, perpendicular to the interface, of the metal oxide film serving as the variable resistor is set such that the layer (depletion layer) having an oxygen concentration lowered due to an increase in deficient oxygen can be uniformly formed in an entire depth direction of the film, the resistance state of the variable resistor can be written and read with high reliability.

In addition to the any one of the first to third characteristics, as a fourth characteristic, in the nonvolatile variable resistive element according to the present invention, the metal oxide film includes a metal oxide having a perovskite structure.

In addition to the fourth characteristics, as a fifth characteristic, in the nonvolatile variable resistive element according to the present invention, the metal oxide film includes an oxide having a perovskite structure expressed by any one general formula ($0 \leq X \leq 1$, $0 \leq Z < 1$) among $Pr_{1-X}Ca_X[Mn_{1-Z}M_Z]O_3$ (wherein M is an element selected from Ta, Ti, Cu, Cr, Co, Fe, Ni, and Ga), $Sm_{1-X}Ca_XMnO_3$, $La_{1-X}AE_XMnO_3$ (wherein AE is dyad alkali earth metal selected from Ca, Sr, Pb, and Ba), $RE_{1-X}Sr_XMnO_3$ (wherein RE is triad rare earth selected from Sm, La, Pr, Nd, Gd, and Dy), $La_{1-X}Co_X[Mn_{1-Z}Co_Z]O_3$, $Gd_{1-X}Ca_XMnO_3$, and $Nd_{1-X}Gd_XMnO_3$.

In addition to the any one of the first to fifth characteristics, as a sixth characteristic, the nonvolatile variable resistive element according to the present invention includes a second insulation film opposite to the insulation film across the variable resistor in a direction perpendicular to the interface, and a fourth electrode opposite to the third electrode across the insulation film, the variable resistor, and the second insulation film in the direction perpendicular to the interface, in which when a voltage not lower than a threshold value is applied between the third electrode and the fourth electrode, the resistance characteristic of the variable resistor transits between two or more different resistance states by an electric field having an element in the direction perpendicular to the interface.

In the case of the nonvolatile variable resistive element according to the sixth characteristic, since the fourth electrode is provided opposite to the third electrode, the resistance state of the variable resistor can be written (programmed and erased) with high reliability by applying the writing voltage between the third and fourth electrodes.

In addition to the sixth characteristic, as a seventh characteristic, in the nonvolatile variable resistive element according to the present invention, the second insulation film is made of a material that does not cause reversible oxygen movement between the variable resistor and the second insulation film through an interface between the variable resistor and the second insulation film even when a voltage required to reversibly move oxygen between the variable resistor and the insulation film through the interface, and to transit the resistance characteristic of the variable resistor is applied between the third electrode and the fourth electrode.

In the case of the nonvolatile variable resistive element according to the seventh characteristic, oxygen moves only through the interface between the variable resistor and the insulation film, and it does not move through the interface between the variable resistor and the second insulation film, so that the resistance state of the variable resistor can be easily controlled by applying the voltage.

In addition to the sixth or seventh characteristics, as an eighth characteristic, in the nonvolatile variable resistive element according to the present invention, the variable resistor has an annular shape, the first electrode and the second electrode are in contact with an upper surface and a lower surface of the annular variable resistor, respectively, and the third electrode is in contact with an outer side wall surface of the annular variable resistor with the insulation film having an annular shape interposed therebetween, and the fourth electrode is in contact with an inner side wall surface of the annular variable resistor with the second insulation film having an annular shape interposed therebetween.

As a first characteristic, a nonvolatile semiconductor memory device according to the present invention made to attain the above object includes a memory cell column provided by connecting the nonvolatile variable resistive elements according to any one of the first to eighth characteristics in series in a column direction, in which the memory cell column is provided in such a manner that the first electrode of the one of the adjacent nonvolatile variable resistive elements is connected to the second electrode of the other nonvolatile variable resistive element, with respect to each nonvolatile variable resistive element in the memory cell column, a first select transistor having a pair of input and output terminals, and a control terminal to control a current flowing between the pair of input and output terminals is provided with respect to each memory cell column, and the first electrode positioned at one end of the memory cell column is connected to one end of the pair of input and output terminals of the first select transistor.

In the case of the nonvolatile semiconductor memory device according to the first characteristic, the memory cell column is formed by arranging the nonvolatile variable resistive elements of the present invention in series in the column direction, and a plurality of the memory cell columns are arranged through at least one select transistor, so that a so-called NAND memory is constituted, and the memory array in which the leak current is prevented can be formed without providing the rectifying element, whereby the large-capacity and inexpensive nonvolatile memory can be implemented.

In addition to the first characteristic, as a second characteristic, in the nonvolatile semiconductor memory device according to the present invention, the memory cell column is provided in such a manner that a second select transistor having a pair of input and output terminals and a control terminal to control a current flowing between the pair of input and output terminals is provided with respect to each memory cell column, and the second electrode positioned at the other end of the memory cell column is connected to one end of the pair of input and output terminals of the second select transistor.

In addition to the second characteristic, as a third characteristic, in the nonvolatile semiconductor memory device according to the present invention, the memory cell columns are arranged in at least a row direction, so that the nonvolatile variable resistive elements are arranged in a matrix shape in the row direction and the column direction, the first electrodes positioned at the one ends of the memory cell columns in the same row or the same column are connected to a common first bit line through the first select transistor, the second electrodes positioned at the other ends of the memory cell columns in the same row or the same column are connected to a common second bit line directly or through the second select transistor, and the third electrodes of the nonvolatile variable resistive elements in the same row are connected to a word line extending in the row direction.

As a fourth characteristic, a nonvolatile semiconductor memory device according to the present invention includes a memory cell column provided by connecting the nonvolatile variable resistive elements according to any one of the sixth to eighth characteristics in series in a column direction, in which the memory cell column is provided in such a manner that the first electrode of the one of the adjacent nonvolatile variable resistive elements is connected to the second electrode of the other nonvolatile variable resistive element, with respect to each nonvolatile variable resistive element in the memory cell column, a first select transistor having a pair of input and output terminals, and a control terminal to control a current flowing between the pair of input and output terminals is provided with respect to each memory cell column, the first electrode positioned at one end of the memory cell column is connected to one end of the pair of input and output terminals of the first select transistor, the memory cell columns are arranged in at least a row direction, so that the nonvolatile variable resistive elements are arranged in a matrix shape in the row direction and the column direction, the first electrodes positioned at the one ends of the memory cell columns in the same row or the same column are connected to a common first bit line through the first select transistor, the second electrodes positioned at the other ends of the memory cell columns in the same row or the same column are connected to a common second bit line directly or through a second select transistor, the third electrodes of the nonvolatile variable resistive elements in the same row are connected to a word line extending in the row direction, and the fourth electrodes of the nonvolatile variable resistive elements in the memory cell column are connected to a common second word line.

In addition to the fourth characteristic, as a fifth characteristic, in the nonvolatile semiconductor memory device according to the present invention, the fourth electrodes of the nonvolatile variable resistive elements in the memory cell columns in the same column are connected to the common second word line.

In addition to the fourth or fifth characteristic, as a sixth characteristic, in the nonvolatile semiconductor memory device according to the present invention, the fourth electrodes of the nonvolatile variable resistive elements in the memory cell columns in the same row are connected to the common second word line.

In addition to any one of the first to sixth characteristics, as a seventh characteristic, in the nonvolatile semiconductor memory device according to the present invention, the memory cell columns are arranged in three-dimensional manner in the row direction, the column direction, and a third direction perpendicular to the row direction and the column direction.

In addition to the first characteristics, as an eighth characteristic, the nonvolatile semiconductor memory device according to the present invention includes the memory cell column provided by connecting the nonvolatile variable resistive elements in series in the column direction perpendicular to a substrate, in which the memory cell columns are arranged in a row direction, and a third direction perpendicular to the row direction and the column direction, so that the nonvolatile variable resistive elements are arranged in the form of a three-dimensional matrix in the row direction, the column direction, and the third direction, the first electrodes positioned at one ends of the memory cell columns arranged in the same position in the third direction are connected to a common first bit line through the first select transistor, the second electrodes positioned at the other ends of the memory cell columns arranged in the same position in the row direction are connected to a common second bit line directly or through a second select transistor, and the third electrodes of the nonvolatile variable resistive elements arranged in the same positions in the column direction are connected to a common word line.

In the case of the nonvolatile semiconductor memory device according to the seventh or eighth characteristic, the memory cell array is configured in three-dimensional manner, so that a further increase in capacity can be expected.

Therefore, according to the present invention, the nonvolatile variable resistive element can perform the reading operation by the low reading voltage, reduce a cell area, and be easily produced, and the large-capacity and inexpensive nonvolatile semiconductor memory device using the nonvolatile variable resistive element can prevent the leak current and be operated at high speed.

BRIEF DESCRIPTION OF THE DRAWINGS

FIGS. 1A to 1D are views to explain a principle of a resistance change in a metal oxide film having a perovskite structure.

FIGS. 3A to 3D are views showing voltage applied conditions in a writing operation and electron states after the writing operation in the nonvolatile variable resistive element according to the first embodiment of the present invention.

FIGS. 4A to 4C are views showing voltage applied conditions in a reading operation and electron states at the time of reading in the nonvolatile variable resistive element according to the first embodiment of the present invention.

DETAILED DESCRIPTION OF THE INVENTION

Hereinafter, a description will be made of an element structure, a method of operation, a principle, and a method of production of a nonvolatile variable resistive element according to the present invention, with reference to the drawings.

First Embodiment

Figure 2:
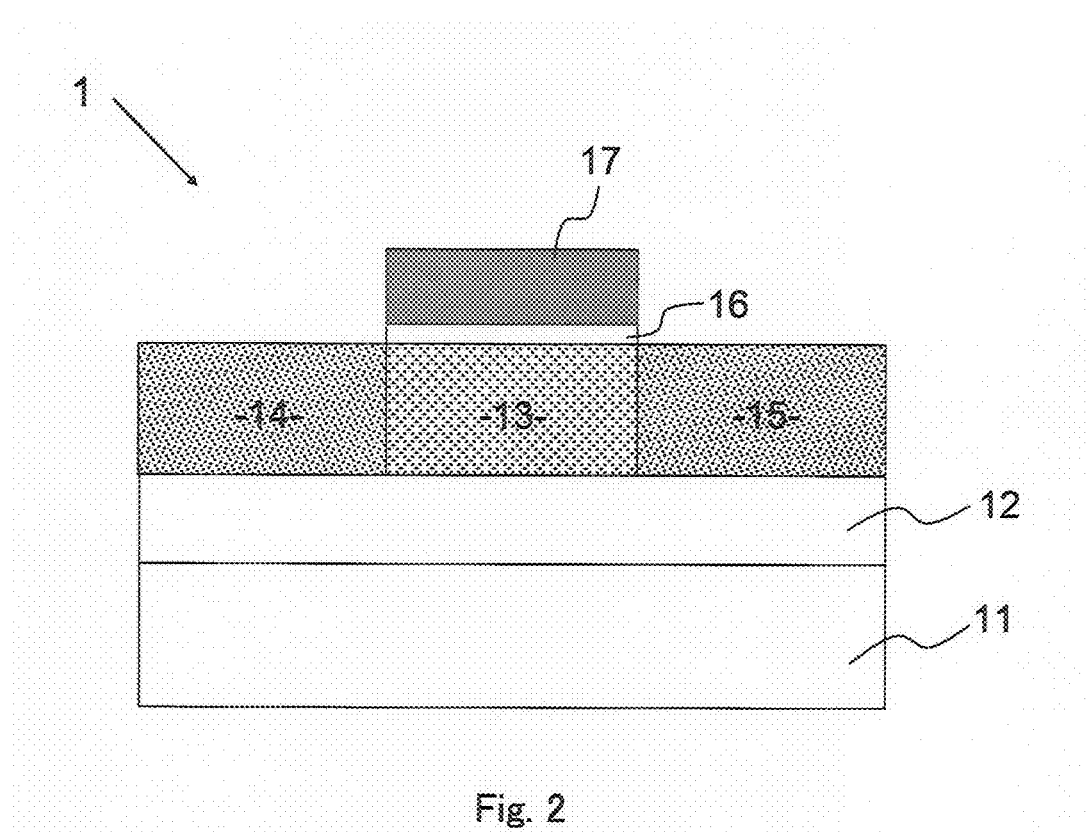
FIG. 2 is a cross-sectional view showing an element structure of a nonvolatile variable resistive element according to a first embodiment of the present invention.

FIG. 2 is a cross-sectional view of an element structure of a nonvolatile variable resistive element according to a first embodiment of the present invention (hereinafter, referred to as the element 1 of the present invention). In addition, a substantial part is overdrawn in the following drawings for convenience of description, so that a dimensional ratio of each part of the element does not always coincide with an actual dimensional ratio.

As shown in FIG. 2, the element 1 of the present invention has metal oxide films 13, 14, and 15 formed on an interlayer insulation film 12 on a substrate 11, an insulation film 16 formed in a predetermined region on the metal oxide films 13 to 15, and a gate electrode (third electrode) 17 formed on the insulation film 16. The metal oxide film 13 is composed of a metal oxide which causes a resistance change depending on an oxide concentration in the film. When a voltage not lower than a threshold value is applied from the gate electrode 17, an electric field not lower than the threshold value is applied to the film in a perpendicular direction, so that oxygen moves between the metal oxide film 13 and the insulation film 16 in a reversible manner. As a result, resistance characteristic of the metal oxide film 13 transits between two or more different resistance states, and one resistance state after the transition is held in a nonvolatile manner. That is, the metal oxide film 13 functions as a variable resistor.

The metal oxide films 14 and 15 are arranged in a direction parallel to an interface between the insulation film 16 and the metal oxide film 13 so as to be apart from each other, and have contact with the metal oxide film 13 so as to sandwich it. Thus, the element 1 of the present invention has the same structure as a field-effect transistor in which a current amount flowing between a source region and a drain region through a channel region is controlled by a voltage applied to a gate electrode. The metal oxide film 13 corresponds to the channel region of the field-effect transistor, and the metal oxide films 14 and 15 correspond to the drain and source regions of the field-effect transistor.

In this embodiment, the metal oxide films 13 to 15 can be made of PCMO ($Pr_{1-X}Ca_XMnO_3$) which is a metal oxide having a perovskite structure. The PCMO is the metal oxide having a p conductivity type and showing ohmic conduction. However, when an oxygen defect increases and an oxygen concentration becomes lower than a stoichiometric composition, a bandgap increases and electric resistance increases. In this embodiment, the metal oxide film 13 functions as the variable resistor by setting the oxygen concentration of the metal oxide film 13 so as to be lower than the stoichiometric composition. Meanwhile, oxygen movement to the insulation film 16 cannot be generated in the metal oxide films 14 and 15, so that the oxygen defect is not introduced and a low-resistance conduction state is always provided therein. That is, the metal oxide films 14 and 15 function as electrodes (first and second electrodes) to sandwich the variable resistor.

The insulation film 16 is composed of a metal oxide having strong electron affinity and being easily connected to oxygen as compared with the metal oxide film 13. For example, the oxide is preferably Ti or Al. As another preferable material, the oxide may be Ta, Hf, Zr, or La. In this embodiment, an Al oxide ($Al_2O_3$) is used.

FIG. 3 shows voltage applied conditions in a writing operation and electron states after the writing operation in the element 1 of the present invention. The element 1 of the present invention stores information in the form of the resistance state of the metal oxide film 13. The resistance state of the metal oxide film 13 includes a low resistance state (FIG. 3A) having less deficient oxygen, and a high resistance state (FIG. 3C) having more deficient oxygen, and the low resistance state and the high resistance state can be reversibly transited by a reset operation (low resistance to high resistance) and a set operation (high resistance to low resistance).

As shown in FIG. 3B, the reset operation is provided such that a voltage Vreset which is positive for the metal oxide film 13 is applied to the gate electrode 17 through a gate terminal, and oxygen in the metal oxide film 13 is moved to the insulation film 16 through the interface with the insulation film 16. The metal oxide films 14 and 15 are grounded (0 V is applied). As a result, the deficient oxygen increases in the metal oxide film 13, and its bandgap increases and the high resistance state is provided. The voltage Vreset is about 2V to 5V, and its lower limit value (absolute value) is determined by a thickness of the metal oxide film 13.

As shown in FIG. 3D, the set operation is provided such that a voltage −Vset which is negative for the metal oxide film 13 is applied to the gate electrode 17 through the gate terminal, and oxygen in the insulation film 16 is moved to the metal oxide film 13. The metal oxide films 14 and 15 are grounded (0 V is applied). As a result, the deficient oxygen decreases in the metal oxide film 13, and its bandgap decreases and the low resistance state is provided. The voltage Vset is about 2V to 5V, and its lower limit value (absolute value) is determined by the thickness of the metal oxide film 13.

FIG. 3A shows a band structure in the low resistance state, and FIG. 3C shows a band structure in the high resistance state. The bandgap is larger in the metal oxide film 13 in the high resistance state having more deficient oxygen than those of the metal oxide films 14 and 15 at both ends. Therefore, movement of carriers (holes) from the metal oxide film 14 or the metal oxide film 15 to the metal oxide film 13 is hindered by an energy barrier provided between the metal oxide films. Meanwhile, the bandgap in the metal oxide film 13 in the low resistance state is the same as or substantially equal to those of the metal oxide films 14 and 15 on both ends, so that the carriers (holes) can be easily moved.

FIG. 4 shows voltage applied conditions at the time of a reading operation and electron states at the time of the reading operation in the element 1 of the present invention. In the case where the metal oxide film 13 is in the low resistance state, as shown in FIG. 4A, there is almost no energy barrier between the metal oxide film 13 and the metal oxide films 14 and 15 under the condition that the gate electrode 17 is not biased, and the element is in the low resistance state regardless of the applied state of the gate voltage, so that when a reading voltage is applied between the metal oxide films 14 and 15, a current flows.

Meanwhile, in the case where the metal oxide film 13 is in the high resistance state, as shown in FIG. 4B, even when a reading voltage Vr is applied between the metal oxide films 14 and 15, movement of the carriers is hindered by the energy barrier between the metal oxide film 13 and the metal oxide films 14 and 15, and the element is in an off state, so that a current hardly flows unless a voltage is applied to the gate electrode 17.

However, as shown in FIG. 4C, when a negative voltage −Vg1 is applied to the gate electrode 17 through the gate terminal, energy VB on a top of a valence band and energy CB on a bottom of a conduction band in the metal oxide film 13 are shifted upward, and as a result, the energy barrier between the metal oxide film 13 and the metal oxide films 14 and 15 on the side of the valence band becomes small and the carriers (holes) can be easily moved. Thus, in this state, when the reading voltage Vr is applied between the metal oxide films 14 and 15, the resistance state of the metal oxide film 13 is temporarily lowered and data can be read. In addition, when a further low negative voltage −Vg2 is applied to the gate electrode 17, the resistance state of the metal oxide film 13 is further lowered, so that the metal oxide film 13 can be a conduction state such that the resistance characteristic is lower than that in the low resistance state when the bias is not applied to the gate electrode 17.

Therefore, when the reading operation is performed under the condition that the negative bias −Vg1 is applied to the gate electrode 17, both resistance characteristics in the low resistance state and the high resistance state of the metal oxide film 13 can be temporarily lowered, so that a large reading current can be obtained even by the low reading voltage, and the reading operation can be performed with a high SN ratio.

In addition, when absolute values of the voltage −Vg1 and −Vg2 applied to the gate electrode 17 at this time are about 0.5 V to 1.0 V and then are set to be sufficiently smaller than the set voltage −Vset at the time of writing operation, the resistance state of the metal oxide film 13 does not transit to the low resistance state. That is, although the resistance characteristic according to the resistance state of the metal oxide film 13 is temporarily lowered when the negative bias is applied to the gate electrode 17, it returns back to the original resistance characteristic defined by the original resistance state as soon as the voltage to the gate electrode 17 is stopped because the metal oxide film 13 still holds the original resistance state.

Figure 5A:
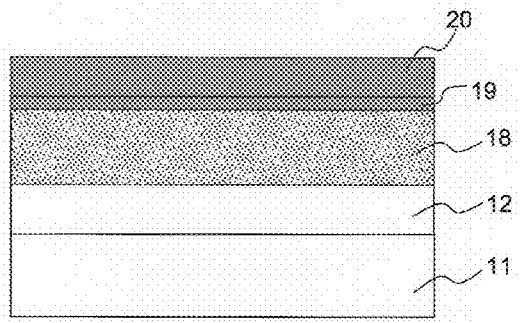
FIGS. 5A to 5C are structure cross-sectional views of steps showing a method for producing the nonvolatile variable resistive element according to the first embodiment of the present invention.

FIG. 5 shows a method for producing the element 1 of the present invention. First, as shown in FIG. 5A, a silicon oxide film is deposited about 200 nm thick on the Si substrate 11 as the interlayer insulation film 12, and then PCMO ($Pr_{1-X}Ca_XMnO_3$) is deposited 100 nm or less thick as a p type metal oxide film 18. The metal oxide film 18 may be an oxide film having a p type perovskite structure such as $Sm_{1-X}Ca_XMnO_3$ instead of $Pr_{1-X}Ca_XMnO_3$.

In addition, metal films 19 and 20 are deposited on the metal oxide film 18. The metal film 19 is made of metal which can be easily oxidized by extracting oxygen from the metal oxide film 18 such as Al, Ti, Ta, Hf, Zr, or La. A film thickness of the metal film 19 may be 2 to 10 nm. In this embodiment, Al is deposited about 5 nm thick as the metal film 19, and W is deposited about 200 nm thick as the metal film 20, on the whole surface.

Figure 5B:
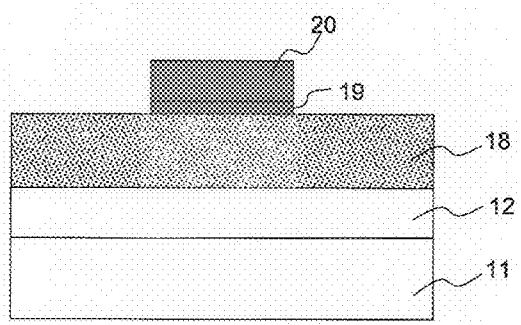

Then, as shown in FIG. 5B, the metal films 19 and 20 are processed by the well-known photolithography and etching, whereby a gate pattern is formed.

Figure 5C:
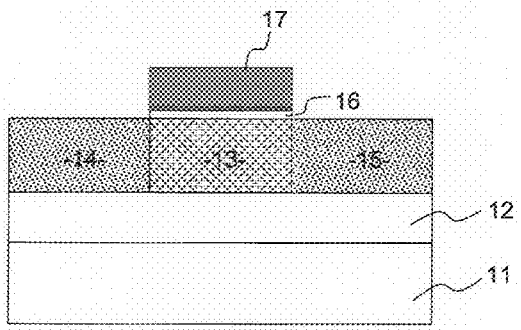

Then, as shown in FIG. 5C, oxygen in the metal oxide film 18 is pulled into the metal film 19 through an interface between the metal oxide film 18 and the metal film 19 by annealing at 200° C. or more. While a gas atmosphere at the time of annealing may be inert gas such as nitrogen, it is preferably introduced with a certain oxygen partial pressure controlled. Thus, an oxygen concentration is locally lowered in the metal oxide film 18 of the channel region under the gate electrode, and the metal oxide film 13 functioning as the variable resistor is formed in the channel region. Meanwhile, a lower layer part of the metal film 19 which is in contact with at least the metal oxide film 13 is oxidized, whereby the insulation film 16 is formed. The metal film 20, and an upper layer part which has not been oxidized in the metal film 19 become the gate electrode 17. In the metal oxide film 18, the metal oxide films 14 and 15 serving as the drain region and the source region which are not covered with the metal film 19 keep in the low-resistance conduction state because oxygen is not extracted by the annealing treatment, whereby the electrode parts to sandwich the variable resistor 13 are formed.

The resistance change phenomenon of the metal oxide film 13 having the perovskite structure in the present invention is caused by a strongly-correlated electron mutual interaction determined by a deficient oxygen concentration, and the deficient oxygen concentration is very higher than an impurity concentration which determines resistance of a semiconductor such as silicon, so that a miniaturization limit of the resistance is far smaller than that of the normal semiconductor.

Therefore, the element 1 of the present invention can be easily produced, and a cell area can be miniaturized, so that the reading can be performed even by the low reading voltage.

Second Embodiment

Figure 6:
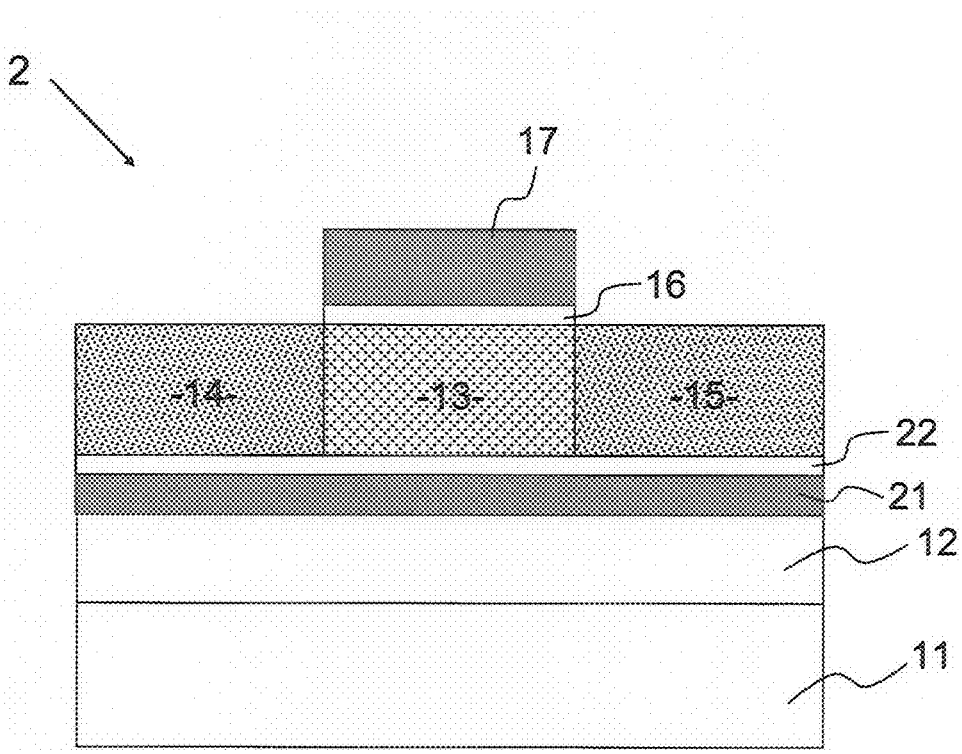
FIG. 6 is a cross-sectional view showing an element structure of a nonvolatile variable resistive element according to a second embodiment of the present invention.

FIG. 6 is a cross-sectional view of an element structure of a nonvolatile variable resistive element according to a second embodiment of the present invention (hereinafter, referred to as the element 2 of the present invention). The element 2 of the present invention further includes an electrode to supply a writing voltage from the side of a substrate, in addition to the components of the element 1 of the present invention, that is, the nonvolatile variable resistive element has a four-terminal structure.

As shown in FIG. 6, the element 2 of the present invention is provided such that a second gate electrode (fourth electrode) 21 is formed on the interlayer insulation film 12 on the substrate 11, and the metal oxide films 13, 14, and 15 are formed on the second gate electrode 21 with a second insulation film 22 interposed therebetween. The insulation film 16 is formed in a predetermined region on the metal oxide films 13 to 15, and the gate electrode (third electrode) 17 is formed on the insulation film 16. That is, the second gate electrode 21 is arranged opposite to the gate electrode 17 across the insulation film 16, the metal oxide film 13 serving as the variable resistor, and the second insulation film 22, and when a writing voltage is applied between the gate electrode 17 and the second gate electrode 21, a resistance state of the variable resistor can be written with high reliability.

Similar to the element 1 of the present invention, the metal oxide film 13 is composed of the metal oxide which causes a resistance change depending on the oxide concentration in the film. When a voltage not lower than the threshold value is applied from the gate electrode 17 and the second gate electrode 21, an electric field not lower than the threshold value is applied to the film in a perpendicular direction, and oxygen moves between the metal oxide film 13 and the insulation film 16 in a reversible manner. As a result, resistance characteristic of the metal oxide film 13 transits between the two or more different resistant states, and one resistance state after the transition is held in the nonvolatile manner.

Unlike the insulation film 16, the second insulation film 22 is made of a material having an oxygen barrier property, so that even when the voltage not lower than the threshold value is applied between the gate electrode 17 and the second gate electrode 21, oxygen does not move between the metal oxide film 13 and the second insulation film 22. Thus, since oxygen only moves through the interface between the metal oxide film 13 and the insulation film 16, the resistance state of the variable resistor can be easily controlled by an applied voltage. The insulation film having the oxygen barrier property can be made of a material such as silicon nitride.

As for the metal oxide films 13 to 15, the insulation film 16, and the gate electrode 17, they have the same configurations as those in the element 1 of the present invention according to the first embodiment, so that their descriptions are omitted.

Figure 7A:
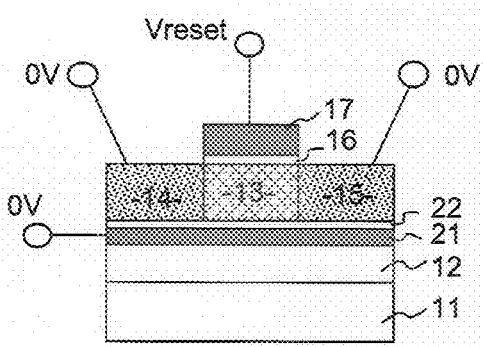
FIGS. 7A and 7B are views showing voltage applied conditions in a writing operation of the nonvolatile variable resistive element according to the second embodiment of the present invention.

FIG. 7 shows voltage applied conditions in a writing operation of the element 2 of the present invention. As shown in FIG. 7A, a reset operation (low resistance state to high resistance state) is performed such that a positive voltage Vreset is applied to the gate electrode 17 through a gate terminal, 0 V is applied to the second gate electrode 21 through a second gate terminal, so that oxygen in the metal oxide film 13 is moved to the insulation film 16 through the interface with the insulation film 16. As a result, the deficient oxygen increases in the metal oxide film 13, its bandgap increases, and the high resistance state is provided. At this time, the metal oxide films 14 and 15 are grounded (0 V is applied), or a voltage is not applied to them to put them into a floating state. The voltage Vreset is about 2V to 5V, and its lower limit value (absolute value) is determined by a thickness of the metal oxide film 13.

Figure 7B:
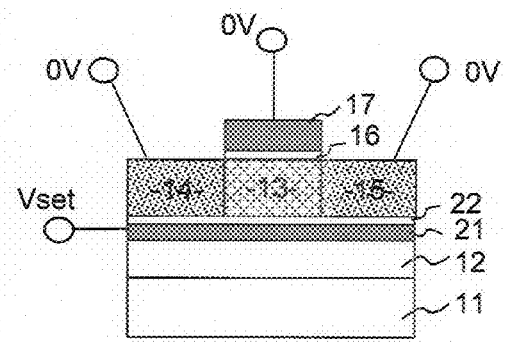

As shown in FIG. 7B, a set operation (high resistance state to low resistance state) is performed such that 0 V is applied to the gate electrode 17 through the gate terminal, and a voltage Vset is applied to the second gate electrode 21 through the second gate terminal to move oxygen in the insulation film 16 to the metal oxide film 13. As a result, the deficient oxygen decreases in the metal oxide film 13, its bandgap decreases, and the low resistance state is provided. At this time, the metal oxide films 14 and 15 are grounded (0 V is applied), or a voltage is not applied to them to put them into the floating state. The voltage Vreset is about 2V to 5V, and its lower limit value (absolute value) is determined by the thickness of the metal oxide film 13.

FIG. 8 shows voltage applied conditions in a reading operation of the element 2 of the present invention. This is almost the same configuration as that in FIG. 4 in the first embodiment except that 0 V is applied to the second gate electrode 21. In addition, the second gate electrode 21 may be put into a floating state. The reading operation in this case is the same as that of the first embodiment.

Figure 8A:
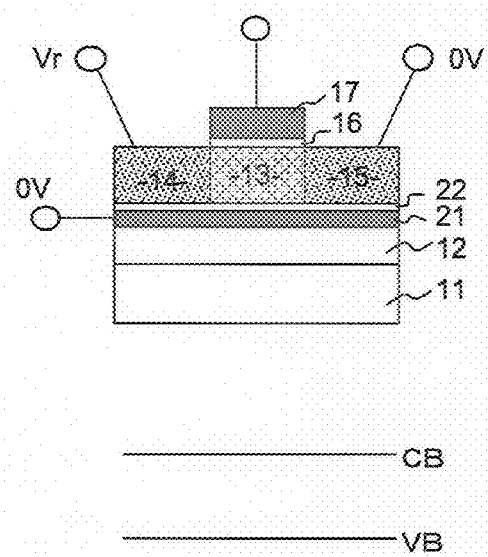
FIGS. 8A and 8B are views showing voltage applied conditions in a reading operation and electron states at the time of reading in the nonvolatile variable resistive element according to the second embodiment of the present invention.

In the case where the metal oxide film 13 is in the low resistance state, as shown in FIG. 8A, there is almost no energy barrier between the metal oxide film 13 and the metal oxide films 14 and 15 under the condition that the gate electrode 17 is not biased, and the element is in the low resistance state regardless of the applied state of the gate voltage, so that when a reading voltage is applied between the metal oxide films 14 and 15, a current flows.

Figure 8B:
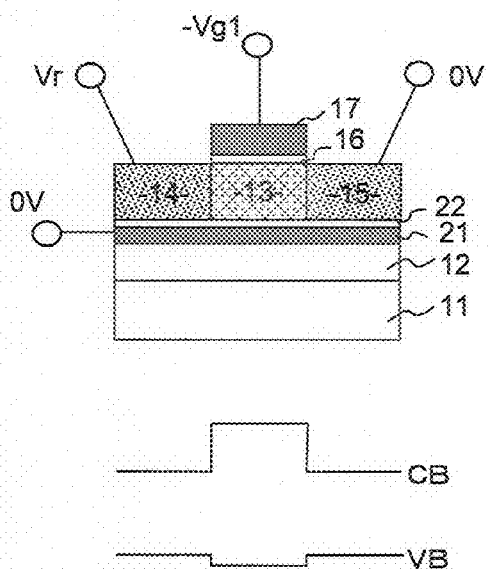

In the case where the metal oxide film 13 is in the high resistance state, as shown in FIG. 8B, the resistance state of the metal oxide film 13 can be temporarily lowered and reading can be performed by applying a negative voltage −Vg1 to the gate electrode 17 through the gate terminal, and applying a reading voltage Vr between the metal oxide films 14 and 15. Furthermore, when a further low negative voltage −Vg2 is applied to the gate electrode 17, the resistance state of the metal oxide film 13 is further lowered, so that the metal oxide film 13 can be a conduction state such that the resistance characteristic is lower than that in the low resistance state when the bias is not applied to the gate electrode 17.

Therefore, when the reading operation is performed under the condition that the negative bias is applied to the gate electrode 17, both resistance characteristics in the low resistance state and the high resistance state of the metal oxide film 13 can be temporarily lowered, so that a large reading current can be obtained even by the low reading voltage, and the reading operation can be performed with a high SN ratio.

In addition, when an absolute value of the voltage −Vg1 applied to the gate electrode 17 at this time is about 0.5 V to 1.0 V and it is set to be sufficiently smaller than the set voltage Vset at the time of writing operation, the resistance state of the metal oxide film 13 does not transit to the low resistance state. That is, while the resistance characteristic according to the resistance state of the metal oxide film 13 is temporarily lowered when the negative bias is applied to the gate electrode, it returns back to the original resistance characteristic defined by the original resistance state as soon as the voltage to the gate electrode 17 is stopped because the metal oxide film 13 still holds the original resistance state.

Figure 9A:
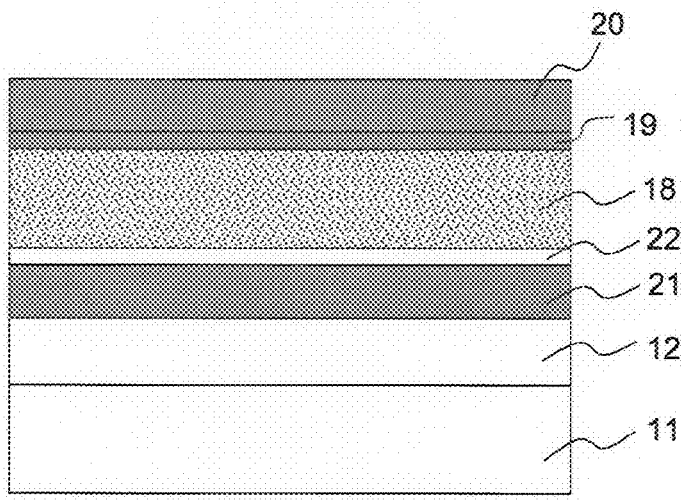
FIGS. 9A to 9C are structure cross-sectional views of steps showing a method for producing the nonvolatile variable resistive element according to the second embodiment of the present invention.

FIG. 9 shows a method for producing the element 2 of the present invention. First, as shown in FIG. 9A, a silicon oxide film is deposited about 200 nm thick on the Si substrate 11 as the interlayer insulation film 12, W is deposited about 100 nm thick as the second gate electrode 21, and silicon nitride is deposited about 10 nm thick on the second gate electrode 21 as the second insulation film 22. Then, PCMO ($Pr_{1-X}Ca_XMnO_3$) is deposited about 100 nm or less thick as the p type metal oxide film 18. The metal oxide film 18 may be an oxide film having a p type perovskite structure such as $Sm_{1-X}Ca_XMnO_3$ instead of $Pr_{1-X}Ca_XMnO_3$. Then, metal films 19 and 20 are deposited on the metal oxide film 18. The metal film 19 is made of metal which can be easily oxidized by extracting oxygen from the metal oxide film 18 such as Al, Ti, Ta, Hf, Zr, or La.

Figure 9B:
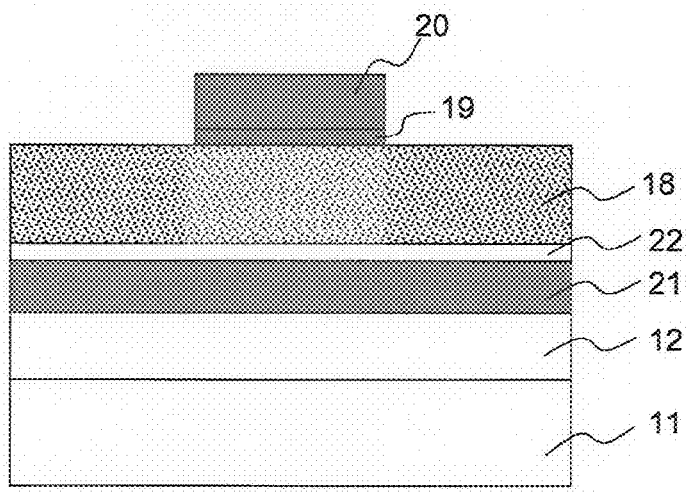

Then, as shown in FIG. 9B, the metal films 19 and 20 are processed by the well-known photolithography and etching, whereby a gate pattern is formed.

Figure 9C:
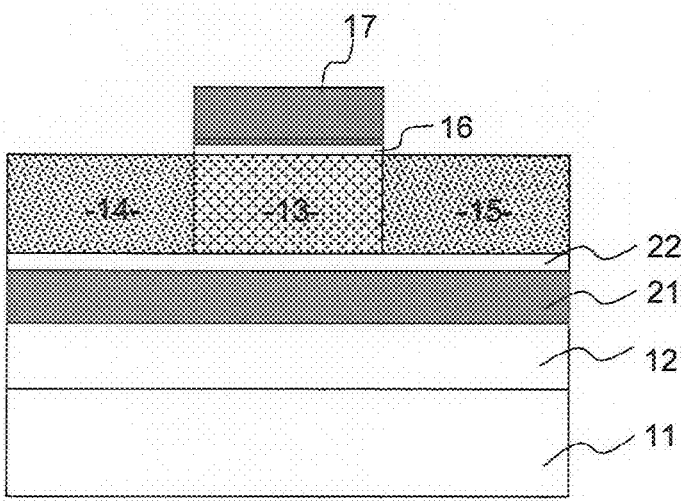

Then, as shown in FIG. 9C, by annealing at 200° C. or more, the metal film 19 is oxidized and a part of the metal oxide film 18 is changed to the variable resistor, whereby the element 2 of the present invention is produced. In addition, a step of depositing the metal films 19 and 20, a step of etching, a step of oxidizing the metal oxide film 19 and changing a part of the metal oxide film 18 to the variable resistor are substantially the same as those in the first embodiment, so that their detailed description have been omitted.

Third Embodiment

Figure 10A:
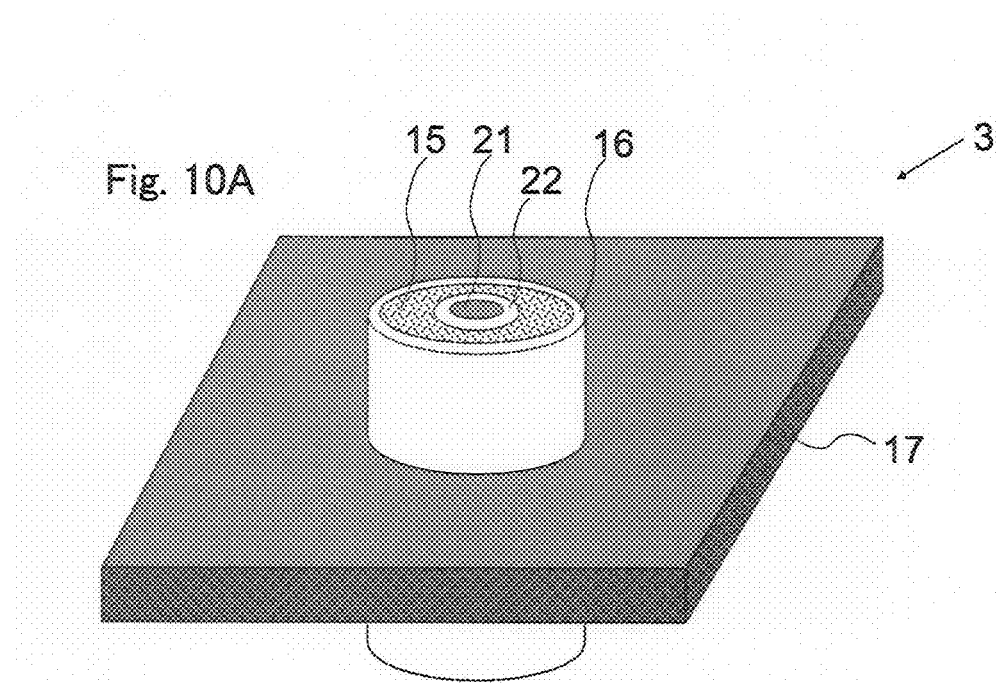
FIGS. 10A and 10B are cross-sectional views showing an element structure of a nonvolatile variable resistive element according to a third embodiment of the present invention.
Figure 10B:
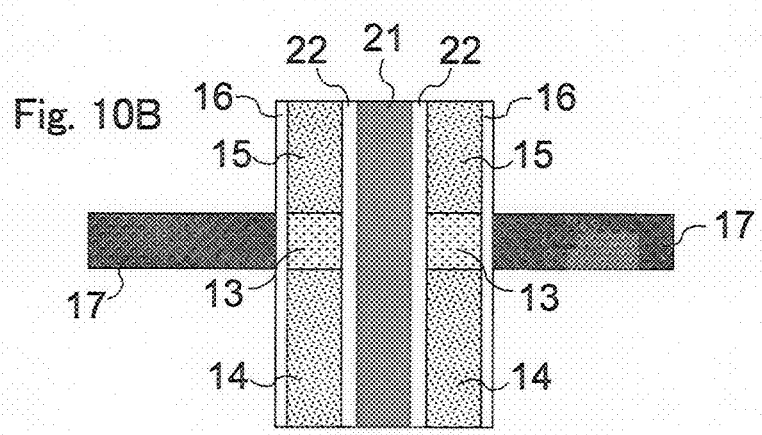

FIG. 10 is a cross-sectional view of an element structure of a nonvolatile variable resistive element according to a third embodiment of the present invention (hereinafter, referred to as the element 3 of the present invention).

The element 3 of the present invention has a structure in which the annular metal oxide films 13, 14, and 15 are laminated in an axial direction, and the annular insulation film 16 is formed on outer side wall surfaces of the annular metal oxide films 13 to 15, and the annular second insulation film 22 is formed on inner side wall surfaces of the annular metal oxide films 13 to 15. That is, the element 3 of the present invention is formed in a cylindrical shape having a three-layer structure in which the second insulation film 22, the metal oxide films 13 to 15, and the insulation film 16 are formed from the inner side in this order, and the plate-shaped gate electrode (third electrode) 17 is formed into a layer shape perpendicular to an axial direction outside the cylinder so as to be in contact with the insulation film 16 and opposite to the metal oxide film 13 across the insulation film 16. Meanwhile, the inside of the cylinder is filled with the second gate electrode (fourth electrode) 21.

The metal oxide films 13 to 15 may be made of PCMO ($Pr_{1-X}Ca_XMnO_3$) which is the metal oxide having the perovskite structure, for example. Similar to the elements 1 and 2 of the present invention, the metal oxide film 13 functions as the variable resistor, and functions as the channel region of a field-effect transistor to control a current amount flowing between the metal insulation film 14 (drain region) and the metal insulation film 15 (source region) by voltage application to the gate electrode 17. The metal oxide films 14 and 15 function as the electrodes (first and second electrodes) to sandwich the metal oxide film 13 serving as the variable resistor.

Voltage applied conditions at the time of reading and writing of the element 3 of the present invention may be the same as those in the element 2 of the present invention.

A method for producing the element 3 of the present invention will be described below. First, an interlayer insulation film and the gate electrode 17 are alternately laminated on a Si substrate, and a through hole is formed so as to penetrate the gate electrode 17 and reach the lower interlayer insulation film. Then, the insulation film 16, the metal oxide film 18 made of PCMO, and the second insulation film 22 are sequentially deposited so as to cover a side wall and a bottom part of the through hole. Then, the through hole is completely filled with the second gate electrode 21. The insulation film 16 is an metal oxide film which is easily oxidized by extracting oxygen from the metal oxide film, such as Al, Ti, Ta, Hf, Zr, or La.

Then, a voltage is applied from the gate electrode 17 to increase deficient oxygen in an interface between the metal oxide film 18 opposite to the gate electrode and the insulation film, whereby the metal oxide film 13 serving as the variable resistor is formed by being separated from the metal oxide films 14 and 15.

As described above, by use of the elements 1 to 3 of the present invention, the nonvolatile variable resistive element can be easily produced, miniaturize its cell area, and perform a reading operation by a low reading voltage.

Fourth Embodiment

When each of the above elements 1 to 3 of the present invention is used as a unit memory cell, a nonvolatile semiconductor memory device can implement large capacity at low cost, prevent a leak current, and perform high-speed operation. Especially, the same operation as a NAND flash memory can be performed in such a manner that a memory cell column is provided by connecting one kind of elements of the elements 1 to 3, in series to compose a NAND nonvolatile semiconductor memory device. Hereinafter, a description will be made in detail of a structure, a method of operation, and a method of production of the nonvolatile semiconductor memory device according to the present invention, with reference to the drawings.

1. Memory Cell Column

Figure 11:
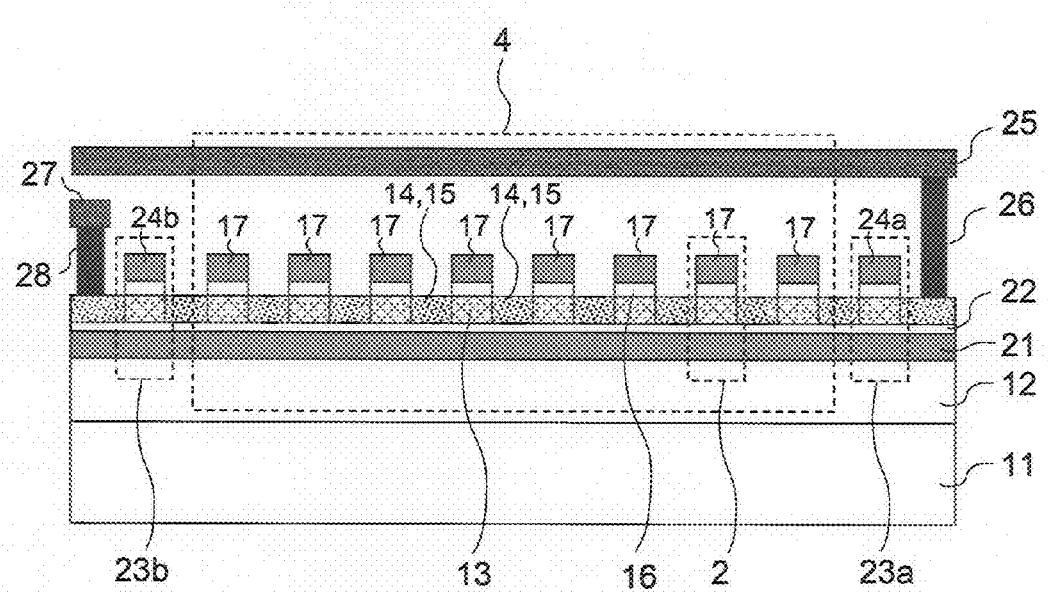
FIG. 11 is a structure cross-sectional view showing an example in which a memory cell column having a NAND structure is constituted with the nonvolatile variable resistive elements according to the second embodiment of the present invention.

FIG. 11 is a structure cross-sectional view showing an example of a memory cell column provided by connecting the elements 2 according to the second embodiment in series. A memory cell column 4 is composed by connecting the elements 2 of the present invention (the number is 8 in this case) in series, in which one ends of a pair of input and output terminals of select transistors 23a and 23b are connected to both ends of the memory cell column 4, respectively. While the number of the elements 2 of the present invention connected in series is not limited in particular, it is preferable to be equal to integral multiple of bites (8, 16, 32, or 64). In addition, while the select transistors 23a and 23b have the same structure as the element 2 of the present invention, they are used as the transistors to select the memory cell column 4 to be read or written without changing the resistance state so as to be kept in the high resistance state in the metal oxide film 13 serving as the variable resistor. As a matter of course, the select transistors 23a and 23b may be formed on a Si substrate.

The other end (drain region 14) of the pair of the input and output terminals of the select transistor 23a which is not connected to the element 2 of the present invention in the memory cell column 4 is connected to a common first bit line 25 extending in a column direction (horizontal direction in the drawing) through a through hole 26, and the other end (source region 15) of the pair of the input and output terminals of the select transistor 23b which is not connected to the element 2 of the present invention in the memory cell column 4 is connected to a common second bit line 27 through a through hole 28. The gate electrodes 17 of the elements 2 of the present invention are connected to first word lines WL1 to WL8, respectively. In addition, each of the second gate electrodes 21 of the elements 2 of the present invention is connected to a second word line WL1'.

Figure 12:
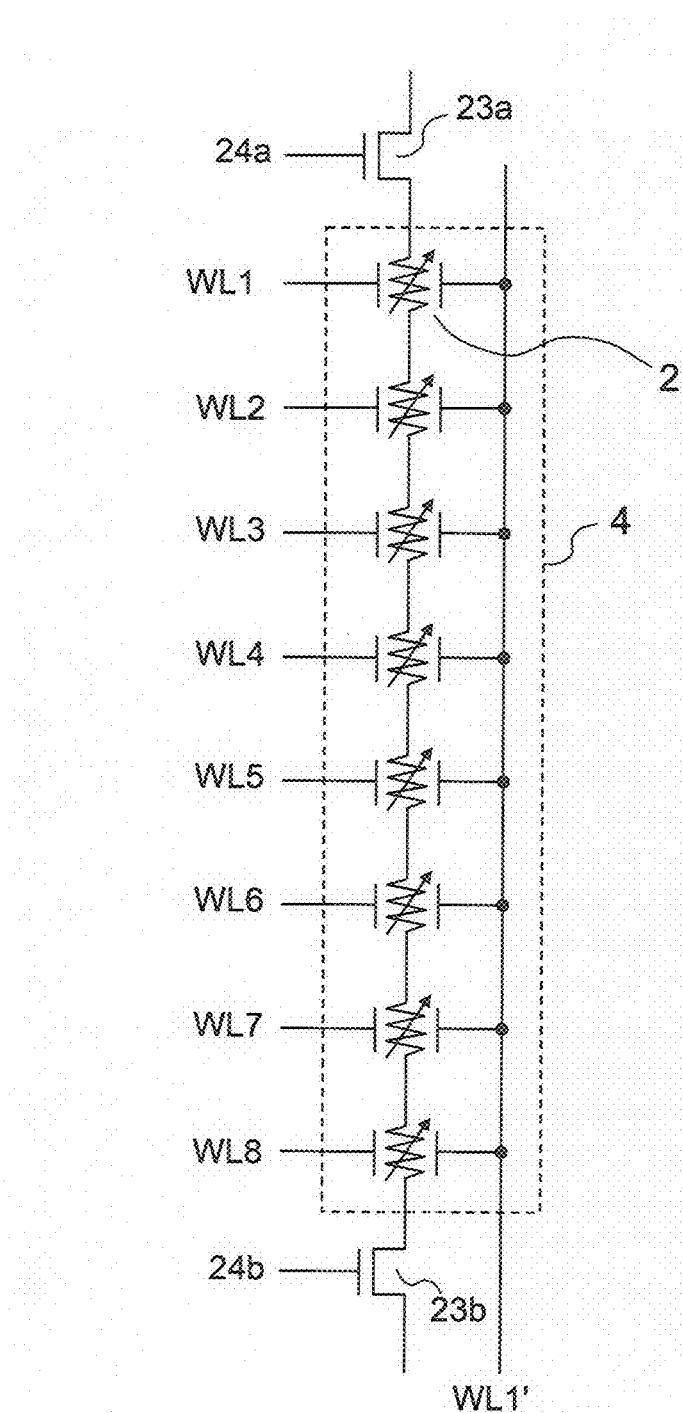
FIG. 12 is an equivalent circuit diagram of the memory cell column having the NAND structure according to the present invention.

FIG. 12 shows an equivalent circuit of the memory cell column 4. In addition, in FIG. 12, a four-terminal nonvolatile variable resistive element having two control terminals is shown such that the same symbol as that of a gate terminal of a MOSFET is allocated to a symbol showing the two-terminal variable resistive element, as a symbol showing the element 2 of the present invention.

2. Memory Cell Array

Figure 13:
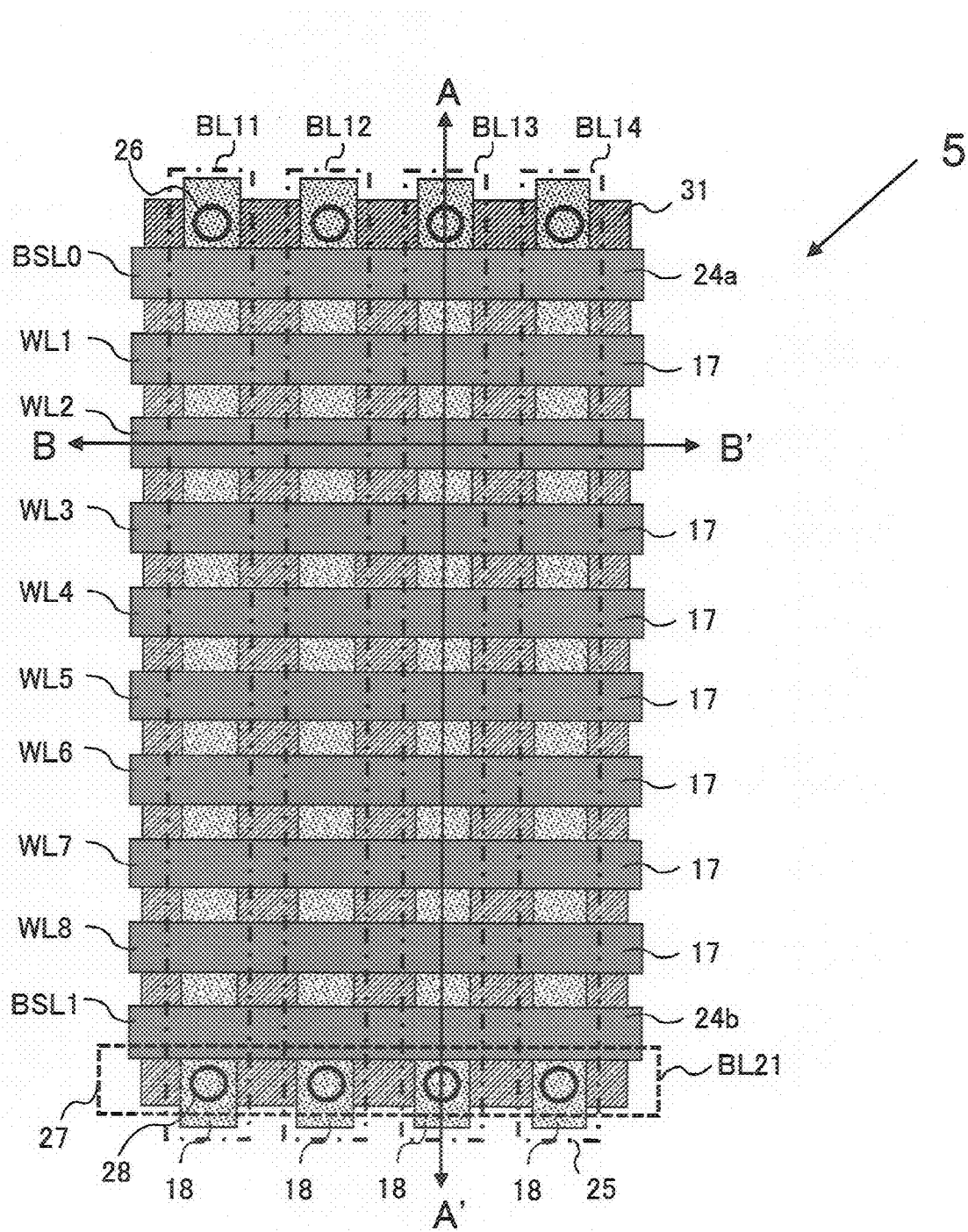
FIG. 13 is a layout diagram showing a configuration example of a memory cell array according to a fourth embodiment of the present invention.
Figure 14:
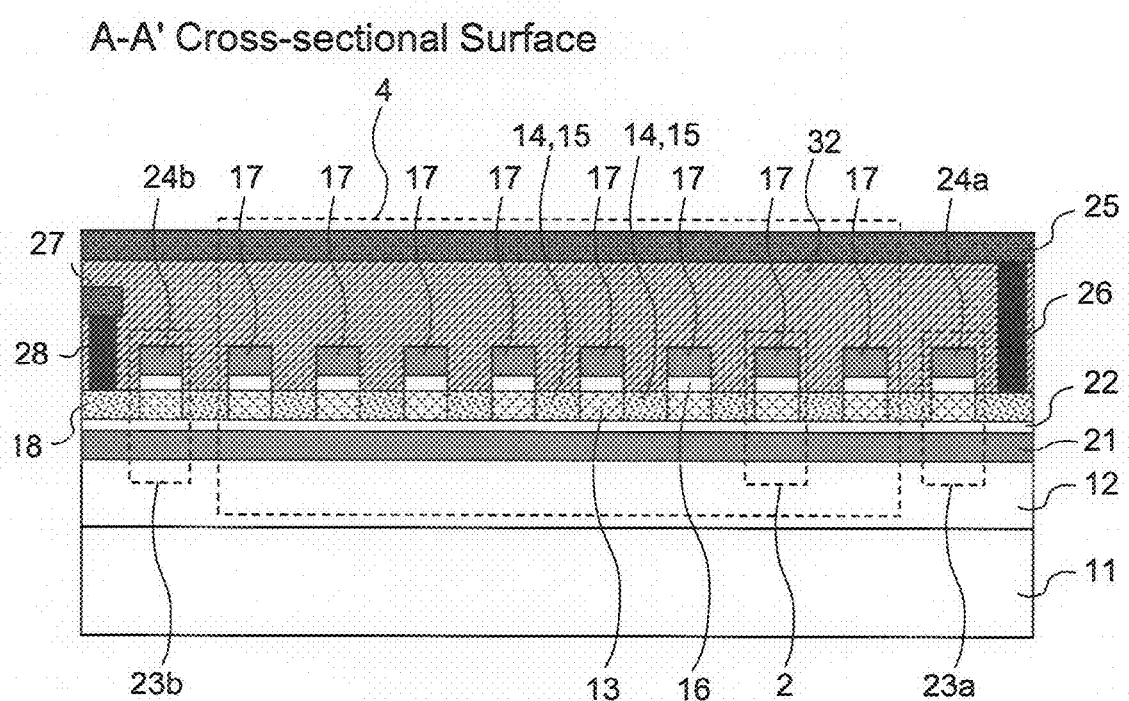
FIG. 14 is a structure cross-sectional view of a memory cell array according to the fourth embodiment of the present invention.
Figure 15:
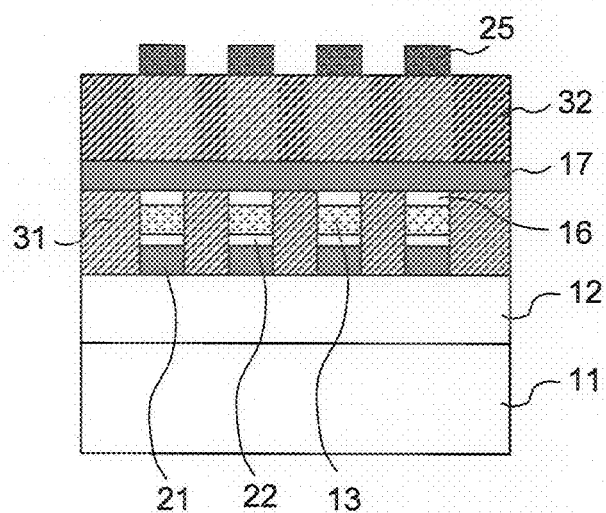
FIG. 15 is a structure cross-sectional view of the memory cell array according to the fourth embodiment of the present invention.
Figure 16:
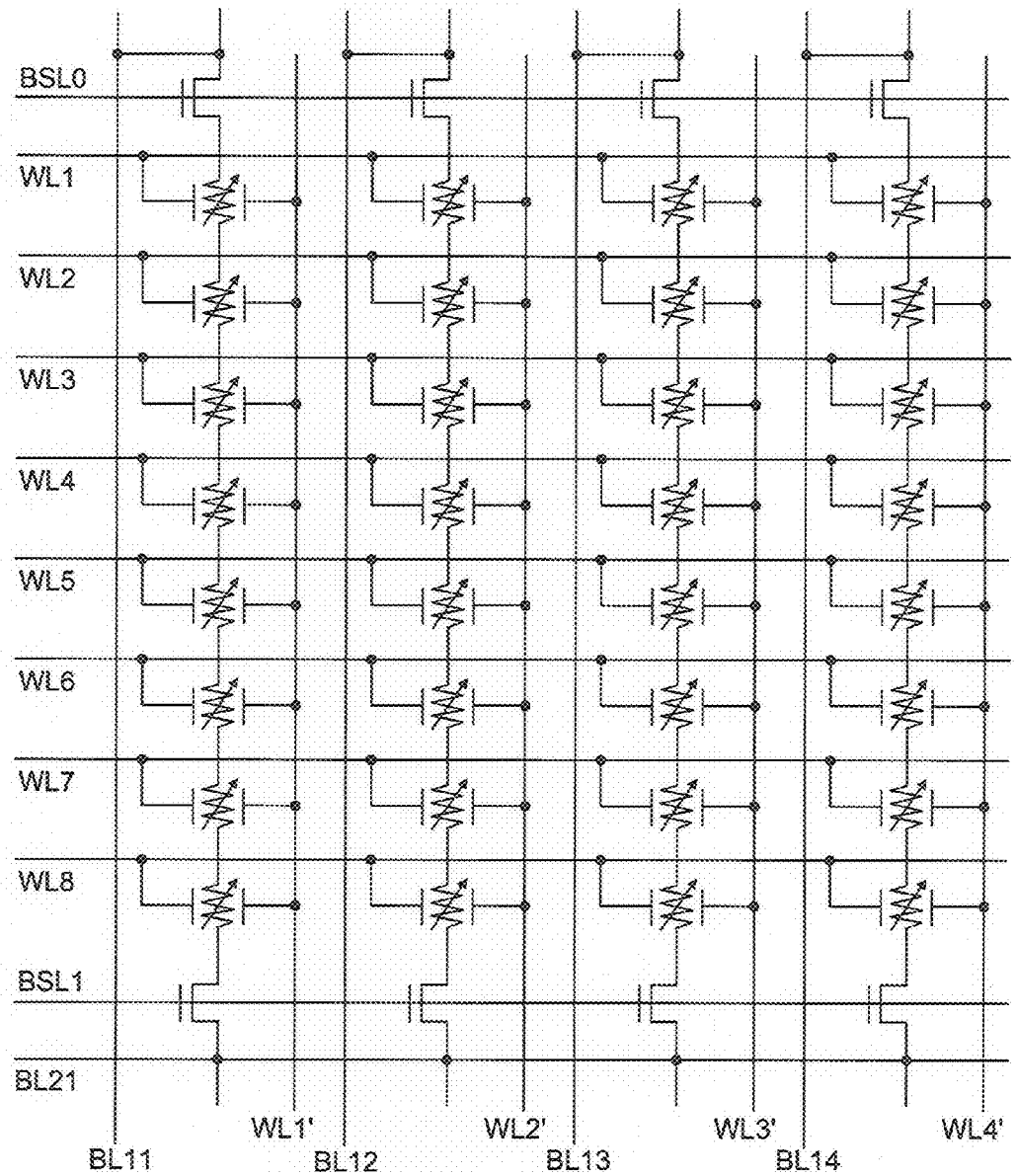
FIG. 16 is an equivalent circuit diagram of the memory cell array according to the fourth embodiment of the present invention.

FIGS. 13 to 15 show an example in which the memory cell columns 4 are arranged in at least a row direction (the number is 4 in this case) to arrange the elements 2 of the present invention in a shape of a matrix, whereby a memory cell array 5 is formed. FIG. 13 shows a layout diagram of the memory cell array 5, and FIGS. 14 and 15 show structure cross-sectional views taken along a line A-A' and a line B-B' in FIG. 13, respectively. FIG. 16 shows an equivalent circuit diagram of the memory cell array 5. In the memory cell array 5, a common bit select line BSL0 extends in a row direction by connecting, in the row direction, gate electrodes 24a of the select transistors 23a arranged in the same position in the column direction (that is, in the same row), and a common bit select line BSL1 extends in the row direction by connecting, in the row direction, gate electrodes 24b of the select transistors 23b arranged in the same position in the column direction (that is, in the same row). In addition, the word lines WL1 to WL8 extend in the row direction by connecting, in the row direction, the first gate electrodes 17 of the elements 2 of the present invention arranged in the same position in the column direction (that is, in the same row), and the common second word lines WL1' to WL4' extend in the column direction by connecting, in the column direction, the second gate electrodes 21 of the elements 2 of the present invention arranged in the memory cell column. That is, the word lines WL1 to WL8 are perpendicular to the second word lines WL1' to WL4', and when an appropriate voltage is applied to each word line and each second word line, any of the elements 2 of the present invention arranged in the matrix is selected and written. In addition, the metal wiring 25 constitutes first bit lines BL11 to BL14, and the metal wiring 27 constitutes the second bit line BL21.

The elements 2 of the present invention arranged in series, and the metal oxide film 18 composed of the channel region 13, the drain region (first electrode part) 14, and the source region (second electrode part) 15 of the select transistors 23a and 23b are formed so as to be separated in the row direction by an interlayer insulation film 31. The drain region 14 of the select transistor 23a connected to the memory cell columns 4 arranged in the same position in the row direction (that is, in the same column) is connected to any of the first bit lines BL11 to BL14 extending in the column direction, through the through hole 26 formed on the metal oxide film 18, and the source region 15 of the select transistor 23b connected to the memory cell columns 4 arranged in the same position in the column direction (that is, in the same row) is connected to the second bit line BL21 extending in the row direction, through the through hole 28 formed on the metal oxide film 18. When an appropriate voltage is applied to each first bit line and each second bit line under the condition that a voltage is applied to each word line and each second word line, any of the elements 2 of the present invention arranged in the matrix is selected and its resistance state can be read by a method which will be described below.

3. Production Method

FIGS. 17 and 18 show one example of a method for producing the memory cell array 5. First, as shown in FIG. 17A, the interlayer insulation film 12, the metal film 21, the insulation film 22, the metal oxide film 18 having the perovskite structure, and the metal film 19 are sequentially deposited on the Si substrate 11 having periphery circuits such as a bit line decoder, and word line decoder. The interlayer insulation film 12 is a silicon oxide film having a thickness of about 200 nm, the metal film 21 is made by depositing W 100 nm to 200 nm thick, and the insulation film 22 is made by depositing a silicon nitride 10 nm or less thick. The metal oxide film 18 having the perovskite structure is made by depositing PCMO ($Pr_{1-x}Ca_xMnO_3$) or $Sm_{1-x}Ca_xMnO_3$ 100 nm or less thick. Here, x represents a positive real number such as 1 or less. The metal film 19 is made by depositing Al 5 nm or less thick. As another example, the metal film 19 may be made of metal which is easily oxidized by extracting oxygen from the metal oxide film 18 such as Ti, Ta, Hf, Zr, or La.

Figure 17A:
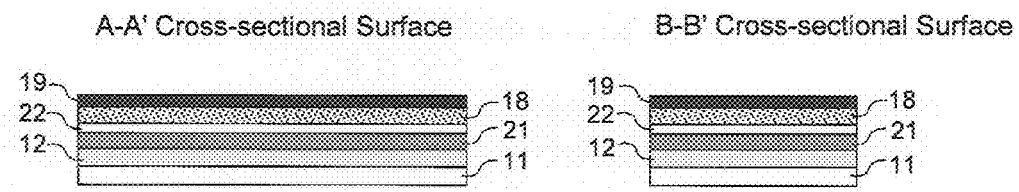
FIGS. 17A to 17D are structure cross-sectional views of steps showing a method for producing the memory cell array according to the fourth embodiment of the present invention.
Figure 17B:
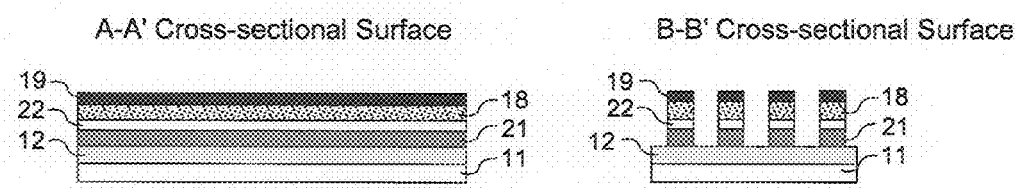

Then, as shown in FIG. 17B, the metal film 19 to the metal film 21 are processed with a resist pattern having a stripe shape in the column direction (A-A' direction), by the well-known photolithography and etching.

Figure 17C:
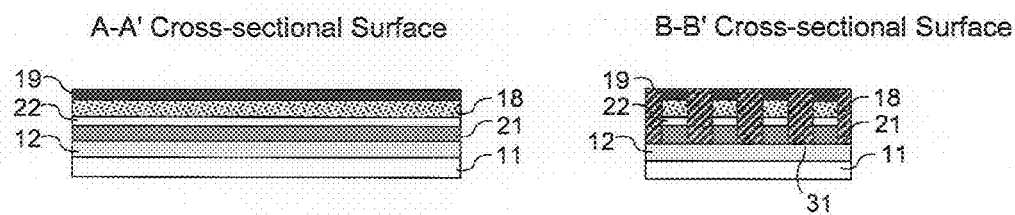

Then, as shown in FIG. 17C, the interlayer insulation film 31 is deposited in gaps by a usual method such as a CVD (Chemical Vapor Deposition) method or plasma CVD method, and the interlayer insulation film 31 is polished and flattened by a usual CMP (Chemical Mechanical Polishing) method, so that the metal film 19 is exposed.

Figure 17D:
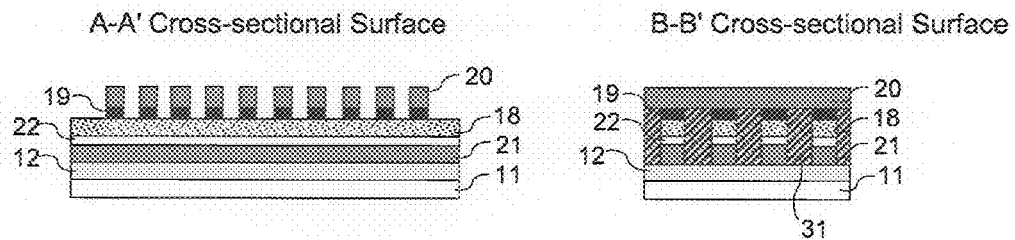

Then, as shown in FIG. 17D, W is deposited about 200 nm thick on the metal film 19 as the metal film 20, and the metal film 20 and the metal film 19 are processed with a resist pattern having a stripe shape in the row direction (B-B' direction), by the well-known photolithography and etching. Thus, the metal film 19 is formed into an island shape. The metal film 20 serves as the gate electrode 17 of the element 2 of the present invention and also the gate electrodes 24a and 24b of the select transistors 23a and 23b, and becomes the word line WL1 to WL8, and the bit select lines BSL0 and BSL1 extending in the row direction.

Figure 18A:
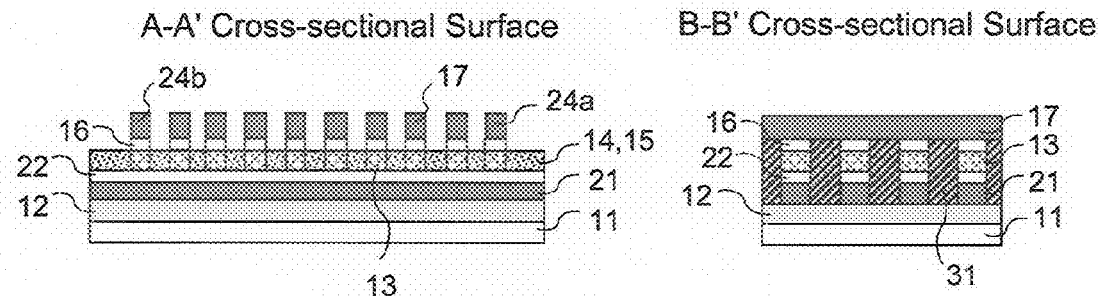
FIGS. 18A to 18C are structure cross-sectional views of steps showing the method for producing the memory cell array according to the fourth embodiment of the present invention.

Then, annealing is performed at 300° C. or higher. Thus, as shown in FIG. 18A, the metal oxide film 18 having the perovskite structure reacts with the metal film 19, whereby the metal film 19 becomes the insulation film 16 because oxygen in the metal oxide film 18 is extracted by the metal film 19 and the metal film 19 is oxidized, and the metal oxide film 18 becomes the variable resistor 13 because the oxygen concentration of the metal oxide film 18 which is in contact with the metal oxide film 16 becomes lower than the stoichiometric composition and its resistance state becomes high. In the region which is not covered with the metal film 19, in the metal oxide film 18, oxygen is not extracted due to the annealing process, so that the low-resistance conduction state is kept, whereby the metal films 14 and 15 of the electrode parts to sandwich the variable resistor 13 are formed.

Figure 18B:
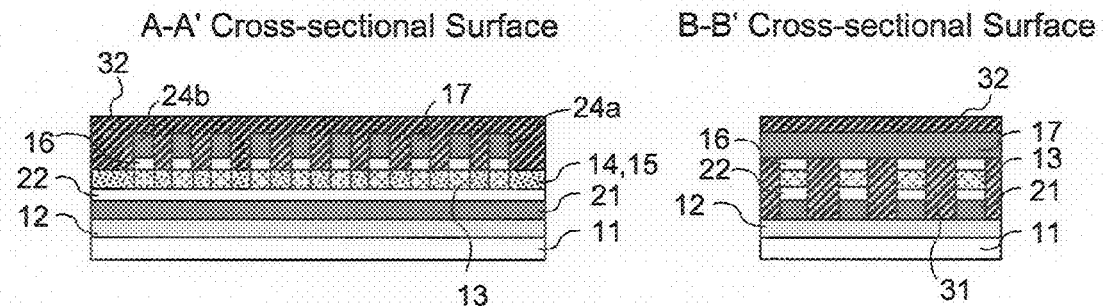
Figure 18C:
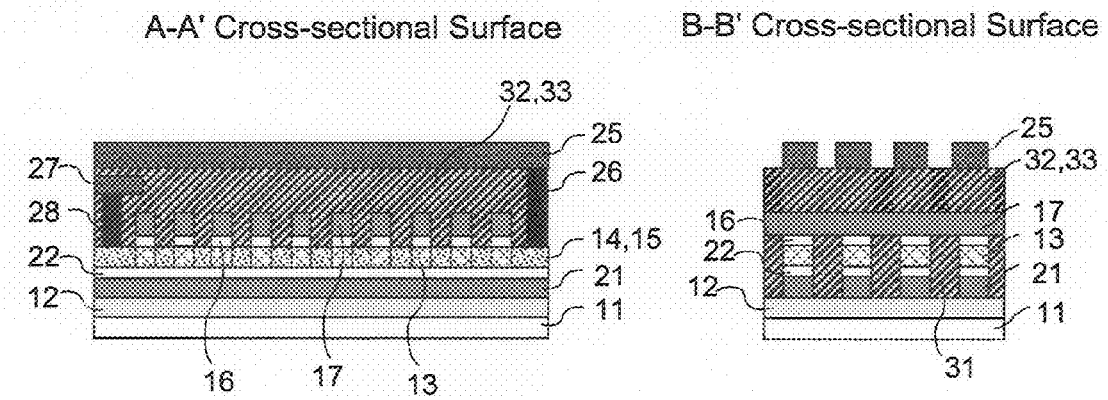

Furthermore, as shown in FIG. 18B, an interlayer insulation film 32 is deposited, and as shown in FIG. 18C, the through hole 28 is formed so as to penetrate the interlayer insulation film 32, and then the metal wiring 27 is formed on the through hole 28. Then, an interlayer insulation film 33 is deposited, the through hole 26 is formed so as to penetrate the interlayer insulation film 33, and the metal wiring 25 is formed on the through hole 26. The metal wiring 25 becomes the first bit line extending in the column direction, and the metal wiring 27 becomes the second bit line extending in the row direction.

The first bit line is connected to a first bit line decoder and a first bit line voltage applying circuit to select the target memory cell column 4 for a memory operation (including programming, erasing, reading operations as will be described below), and to apply a voltage required for the memory operation to the first bit line. In addition, the second bit line is connected to a second bit line decoder and a second bit line voltage applying circuit to select the target memory cell column 4 for the memory operation, and to apply a voltage required for the memory operation to the second bit line. In addition, the word line is connected to a word line decoder and a word line voltage applying circuit to select the target element 2 of the present invention for the memory operation from the memory cell column 4, and to apply a voltage required for the memory operation to each word line. Furthermore, the bit select line is connected to a bit select line decoder to select the target memory cell column 4 for the memory operation in the column direction. In addition, a readout circuit is provided to read the resistance state of the selected element 2 of the present invention through the selected first and second bit lines. Thus, the nonvolatile semiconductor memory device according to the present invention is configured. In addition, as for the first and second bit line decoders, the first and second bit line voltage applying circuits, the word line decoder, the word line voltage applying circuit, the bit select line decoder, and the readout circuit, since various well-known configurations used in the general nonvolatile semiconductor memory device are available for their configurations, they are not described here.

4. Writing and Reading Method 4.1 Batch Erasing Operation

Figure 19:
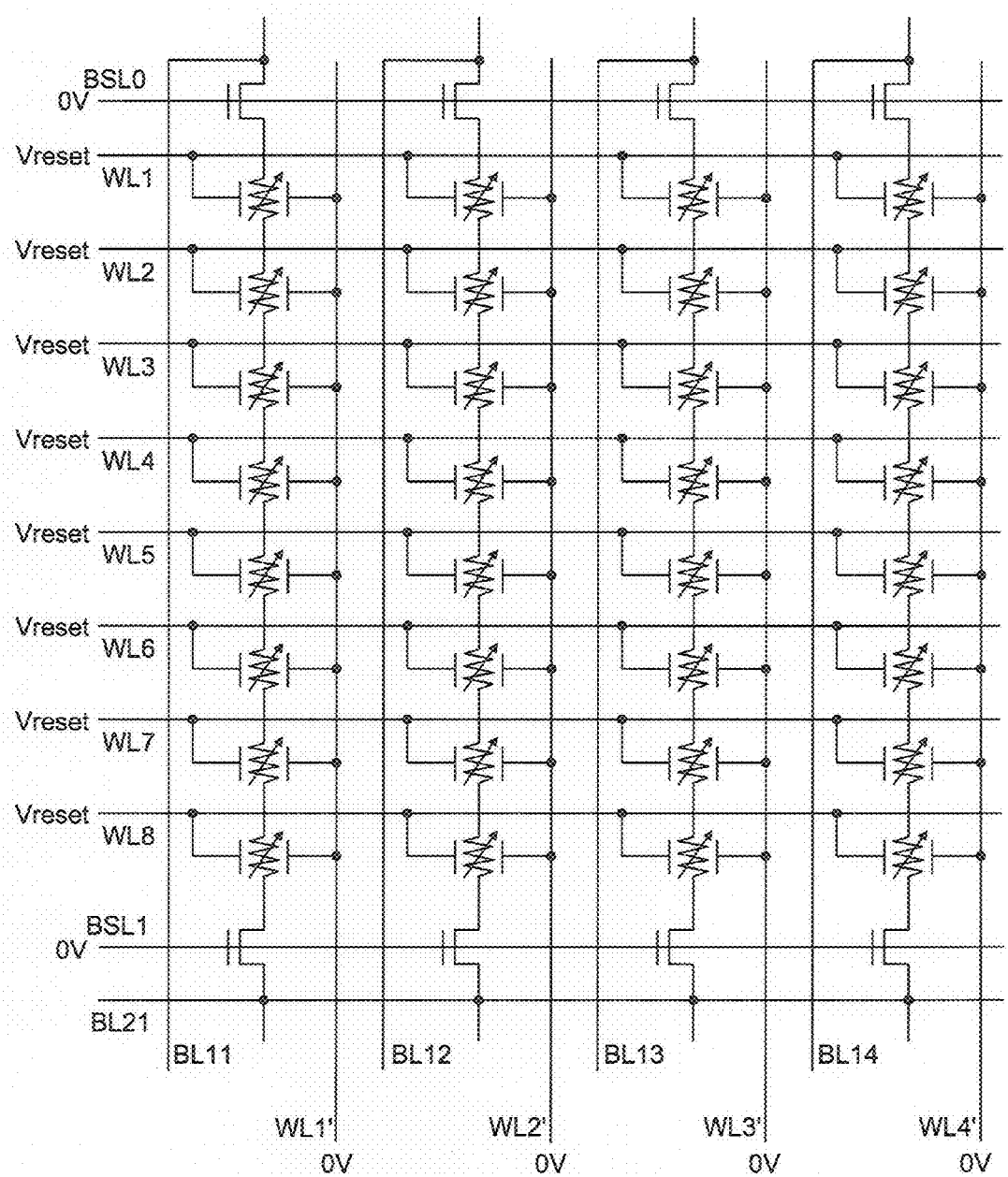
FIG. 19 is a view showing a voltage applied condition in an erasing operation of the memory cell array according to the fourth embodiment of the present invention.

FIG. 19 shows an example of a voltage applied condition at the time of batch erasing (reset) operation in the memory cell array 5. At the time of the reset operation, a voltage (such as 0 V) is applied to the bit select lines BSL0 and BSL1 so that the select transistors 23*a* and 23*b* become the off state with respect to all the memory cell columns of the selected rows, and each memory cell column 4 is separated from the first bit lines BL11 to BL14 and the second bit line BL21. A positive voltage Vreset is applied to the word lines WL1 to WL8 of the selected memory cell columns, and the second word lines WL1' to WL4' are grounded (0 V is applied). Thus, oxygen in the metal oxide film 13 under the gate electrode 17 is moved to the side of the insulation film 16 by an electric field, the resistance of the elements 2 of the present invention in the selected memory cell columns all become high.

4.2 Erasing Operation Per Cell

Figure 20:
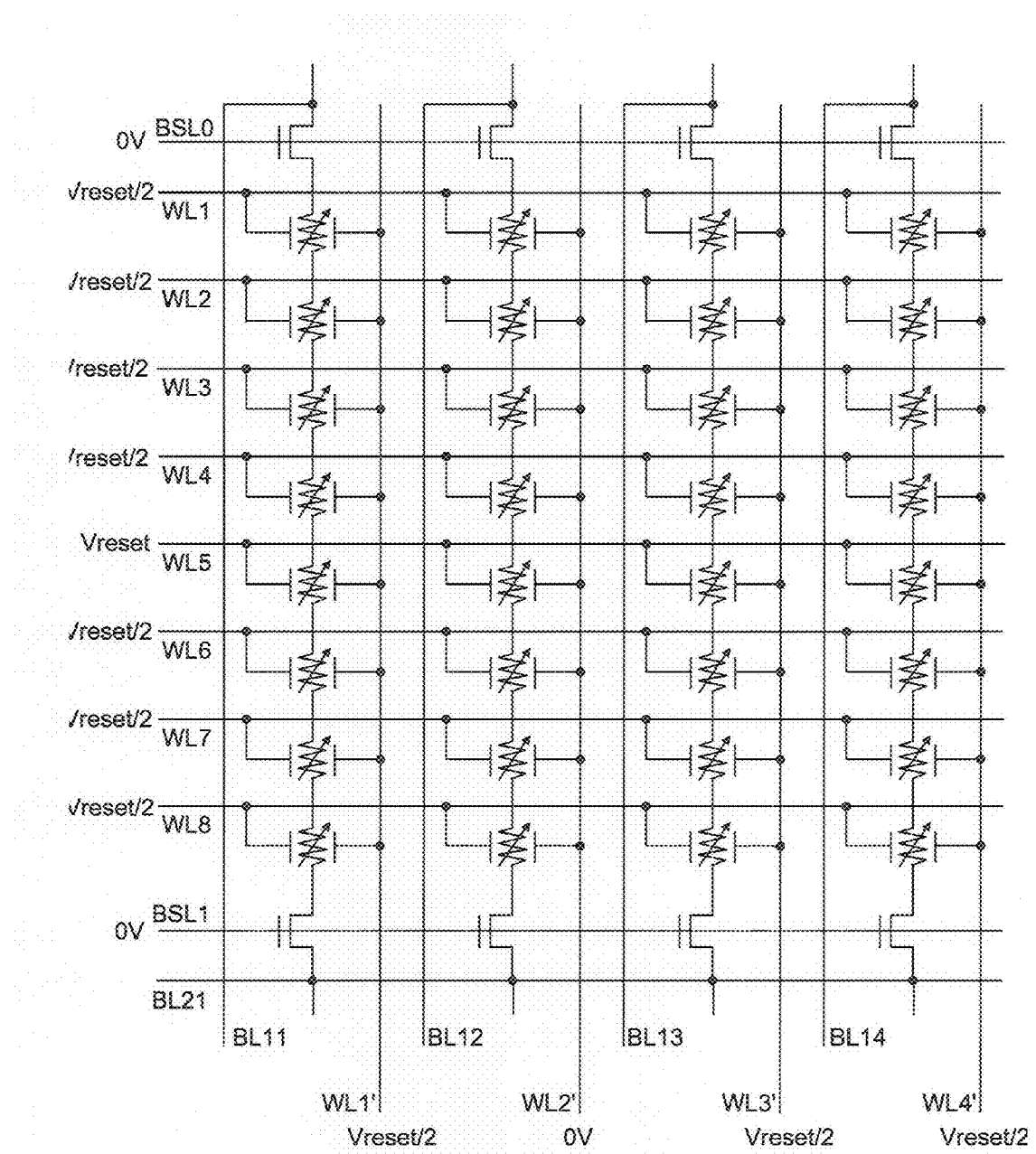
FIG. 20 is a view showing a voltage applied condition in the erasing operation of the memory cell array according to the fourth embodiment of the present invention.

FIG. 20 shows one example of a voltage applied condition when the erasing (reset) operation is performed for each memory cell in the memory cell array 5. Here, it is assumed that the memory cells connected to the word line WL5 and the second word line WL2' are selected as the erasing target. A voltage (such as 0 V) is applied to the bit select lines BSL0 and BSL1 so that the select transistors 23*a* and 23*b* become the off state with respect to the rows including the selected memory cell column, and each memory cell column 4 is separated from the first bit lines BL11 to BL14, and the second bit line BL21. A voltage Vreset/2 is applied to the word lines (WL1 to WL4 and WL6 to WL8) corresponding to the unselected rows in the memory cell array, and the second word lines (WL1', WL3' and WL4') corresponding to the unselected columns in the memory cell array, the voltage Vreset is applied to the selected word line WL5, and 0 V is applied to the selected second word line WL2'. Here, the voltage Vreset is not lower than the threshold voltage to cause the resistance change of the metal oxide film serving as the variable resistor from the low resistance state to the high resistance state, and the voltage Vreset/2 is lower than the threshold voltage. Thus, in the element 2 of the present invention positioned at an intersection between the selected word line WL5 and the selected second word line WL2', oxygen in the insulation film 16 is moved to the metal oxide film 13 by an electric field, and the resistance of the selected element 2 of the present invention becomes high. Since the voltage Vreset/2 is applied to the gate electrode and the second gate electrode of the memory cell unselected in both word line and second word line, the resistance state of the element 2 of the present invention is not changed. The voltage Vreset/2 is applied between the gate electrode and the second gate electrode of the memory cell in which one of the word line and the second word line is selected and the other is not selected, but the voltage is lower than the threshold voltage to cause transition to the high resistance state, so that the resistance state of the element 2 of the present invention is not changed.

4.3 Programming Operation Per Cell

Figure 21:
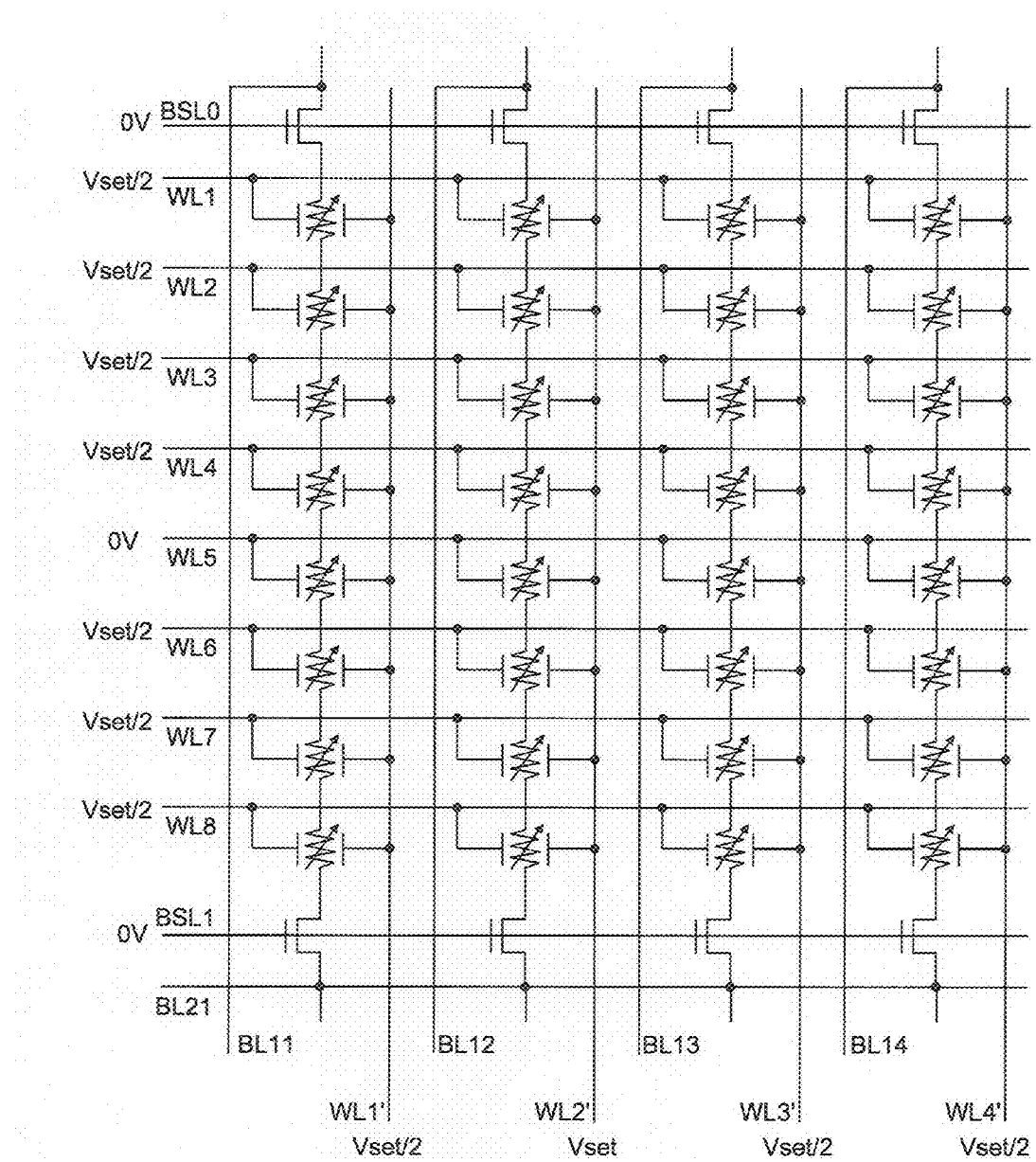
FIG. 21 is a view showing a voltage applied condition in a programming operation of the memory cell array according to the fourth embodiment of the present invention.

FIG. 21 shows one example of a voltage applied condition when a programming (set) operation is performed for each memory cell in the memory cell array 5. Here, it is assumed that memory cells connected to the word line WL5 and the second word line WL2' are selected as a programming target. At the time of the set operation, a voltage is applied to the bit select lines BSL0 and BSL1 so that the select transistors 23*a* and 23*b* become the off state with respect to the rows including the selected memory cell columns, and the respective memory cell columns 4 are separated from the first bit lines BL11 to BL14, and the second bit line BL21. A voltage Vset/2 is applied to the word lines (WL1 to WL4 and WL6 to WL8) corresponding to the unselected rows in the memory cell array, and the second word lines (WL1', WL3', and WL4') corresponding to the unselected columns in the memory cell array, 0 V is applied to the selected word line WL5, and the voltage Vset is applied to the selected second word line WL2'. Here, the voltage Vset is not lower than the threshold voltage to cause the resistance change of the metal oxide film serving as the variable resistor from the high resistance state to the low resistance state, and the voltage Vset/2 is lower than the threshold voltage. Thus, in the element 2 of the present invention positioned at an intersection between the selected word line WL5 and the selected second word line WL2', oxygen in the insulation film 16 is moved to the metal oxide film 13 by an electric field, and the resistance of the selected element 2 of the present invention becomes low. Since the voltage Vset/2 is applied to the gate electrode and the second gate electrode of the memory cell unselected in both word line and second word line, the resistance state of the element 2 of the present invention is not changed. The voltage Vset/2 is applied between the gate electrode and the second gate electrode of the memory cell in which one of the word line and the second word line is selected and the other is not selected, but the voltage is lower than the threshold voltage to cause transition to the low resistance state, so that the resistance state of the element 2 of the present invention is not changed.

4.4 Reading Operation

Figure 22:
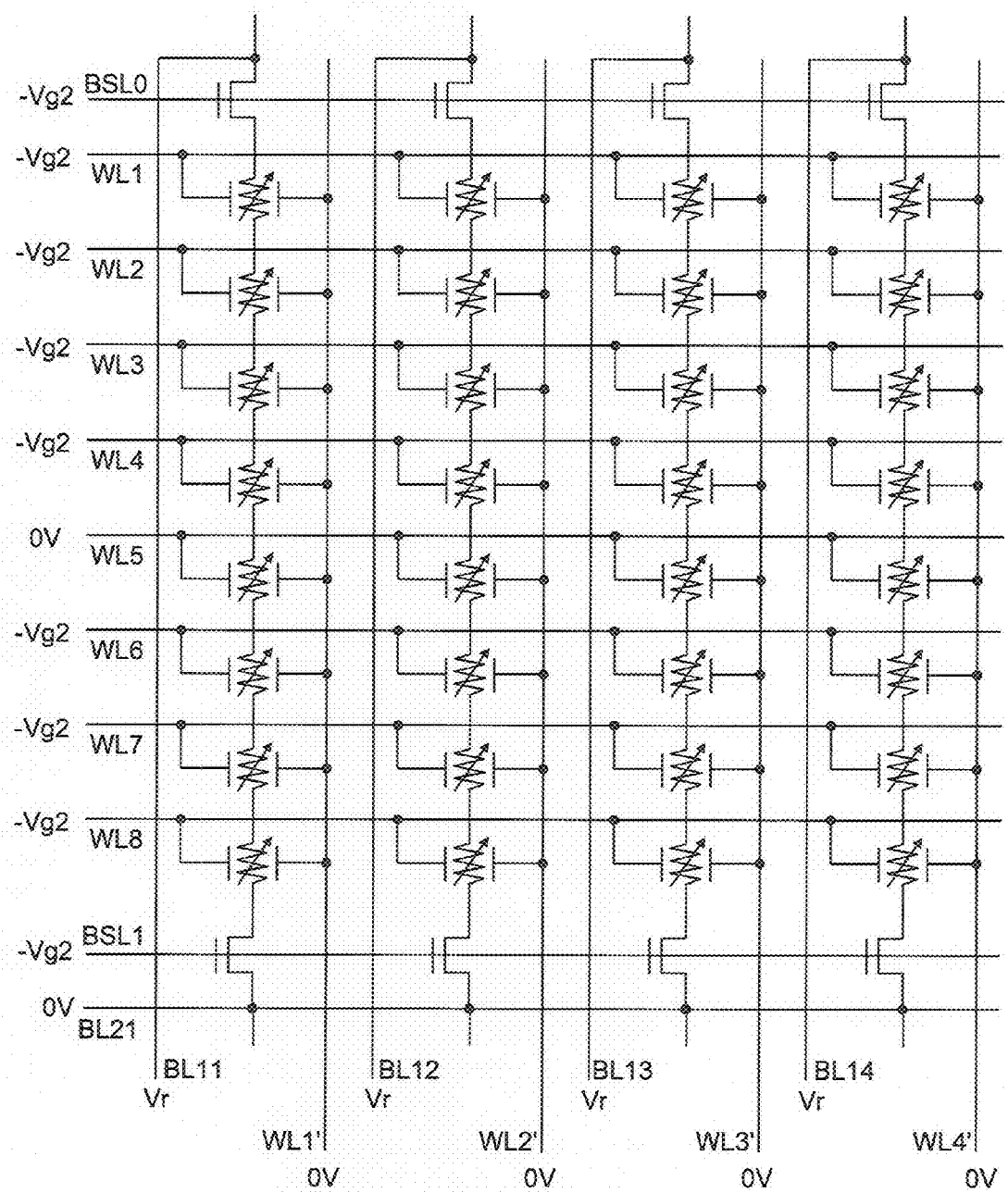
FIG. 22 is a view showing a voltage applied condition in a reading operation of the memory cell array according to the fourth embodiment of the present invention.

FIG. 22 shows one example of a voltage applied condition at the time of a reading operation in the memory cell array 5.

In this embodiment, the resistance state of the elements 2 of the present invention belonging to the same row connected to the selected word line are read at the same time. The second word lines WL1' to WL4' are all grounded (0 V is applied), the selected word line WL5 is grounded (0 V is applied), and a voltage −Vg2 (such as −1.0 V) is applied to the unselected word lines WL1 to WL4, WL6 to WL8. The voltage −Vg2 is also applied to the bit select lines BSL0 and BSL1 to turn on the select transistors 23a and 23b. Here, the resistance state of the selected element 2 of the present invention is read by applying a reading voltage Vr (such as 0.5 V) to one end of the selected memory cell column through the first bit line, and applying 0 V to the other end of the selected memory cell column through the second bit line.

As for the unselected element 2 of the present invention, a voltage Vg2 is applied between the gate electrode 17 and the second gate electrode 21, and the voltage applied to the gate electrode 17 becomes −Vg2 or lower based on a potential of the drain region 14 or the source region 15 provided at both ends of the unselected element 2 of the present invention, so that the resistance characteristic according to the resistance state of the metal oxide film 13 of the channel region becomes temporarily low, that is, conduction state is provided. Meanwhile, as for the selected element 2 of the present invention, since the gate electrode 17 and the second gate electrode 21 are at the same voltage, the resistance characteristic according to the high resistance state or the low resistance state is held. Therefore, only the resistance state of the selected element 2 of the present invention can be read by applying the reading voltage Vr to both ends of the memory cell column 4 through the first bit line and the second bit line.

In addition, at this time, the reading operation may be performed under the condition that a voltage −Vg1 (such as 0.5 V) is applied to the selected word line WL5, and the resistance state is temporarily lowered in the metal oxide film 13 of the channel region of the selected element 2 of the present invention. Thus, a large reading current can be obtained even by a low reading voltage.

In each case, since a potential difference Vg2 between the gate electrode 17 and the second gate electrode 21 is sufficiently lower than the reset voltage Vreset and the set voltage Vset, the resistance state of the metal oxide film 13 is not written. The resistance state of the metal oxide film 13 keeps the original resistance state, so that when the voltage applied to the gate electrode 17 and the second gate electrode is stopped, the resistance characteristic returns to the one defined by the original resistance state.

Figure 23A:
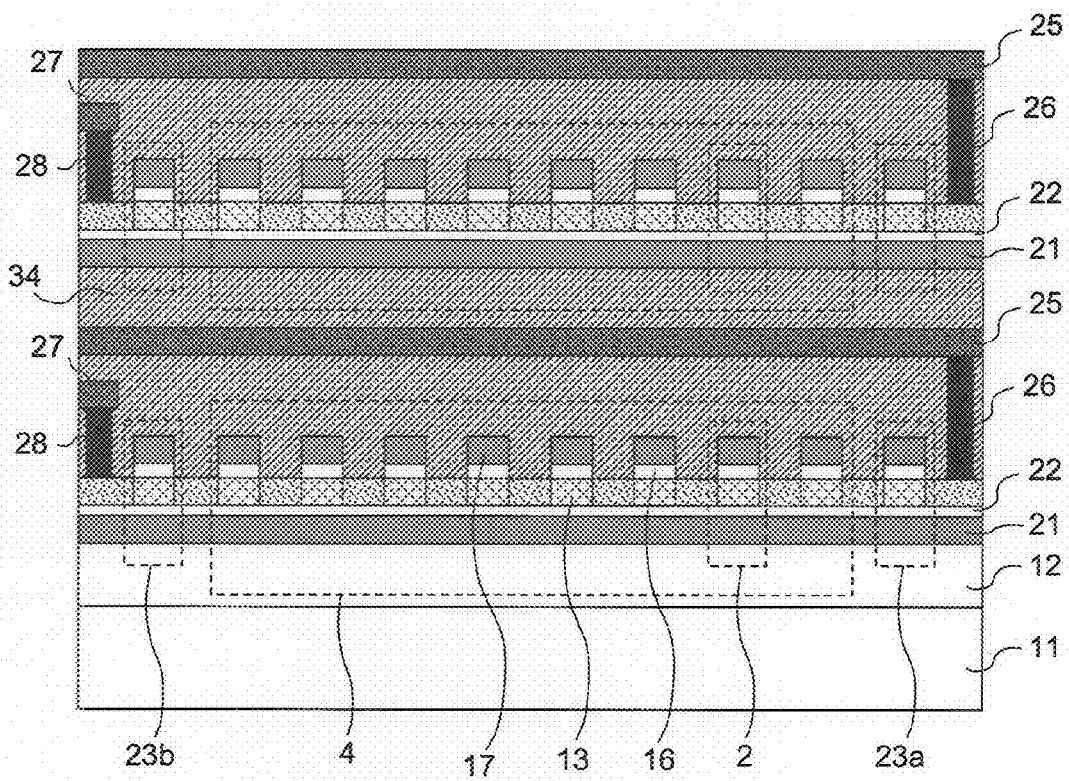
FIGS. 23A and 23B are structure cross-sectional views of a configuration in which two memory cell arrays according to the fourth embodiment of the present invention are laminated.
Figure 23B:
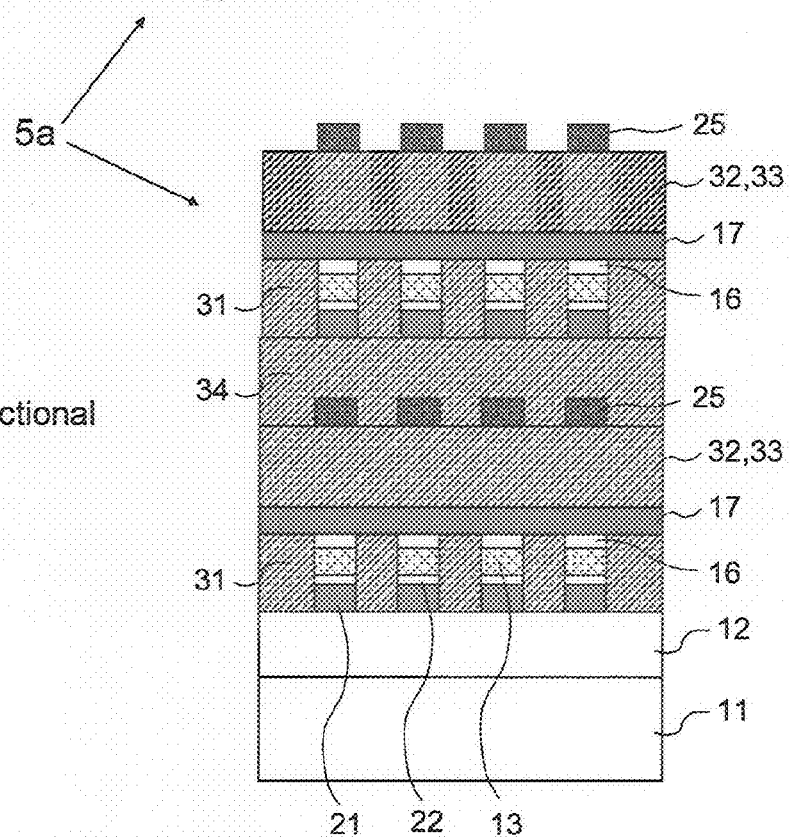

Since the memory cell is composed of the metal oxide films 13 to 15 in the above memory cell array 5, capacity can be easily increased by multiplying the layers. FIG. 23 shows a memory cell array 5a formed in such a manner that the steps shown in FIGS. 17A to 18C are repeated twice and the two memory cell arrays 5 are laminated with an interlayer insulation film 34 interposed therebetween. As shown in FIG. 23, the memory cell array 5a is composed of two layers of structures shown in FIGS. 13 to 15, so that the memory cell columns are arranged in a matrix shape in the row and column directions and the third direction perpendicular to the substrate, whereby a three-dimensional memory cell array is formed. Obviously, the capacity can be further increased by repeating the same steps to form a multilayer memory cell array.

Fifth Embodiment

In the case where the capacity is increased with the multilayered memory cell array, the number of steps inevitably increases. Thus, the problem is that an effect of a reduction in bit cost due to the multilayered structure is reversed with an increase in process cost. However, in order to solve the problem with a NAND flash memory, an academic conference recently reports a method to implement both multilayered structure and increase in capacity without increasing the number of steps, by forming multilayered gate electrodes (word lines) with an interlayer insulation films interposed therebetween, forming a through hole therein, and forming a gate insulation film and a polycrystalline Si channel layer on a side wall of the through hole. Since the device according to the present invention has the NAND configuration, an equivalent configuration can be implemented.

Figure 24:
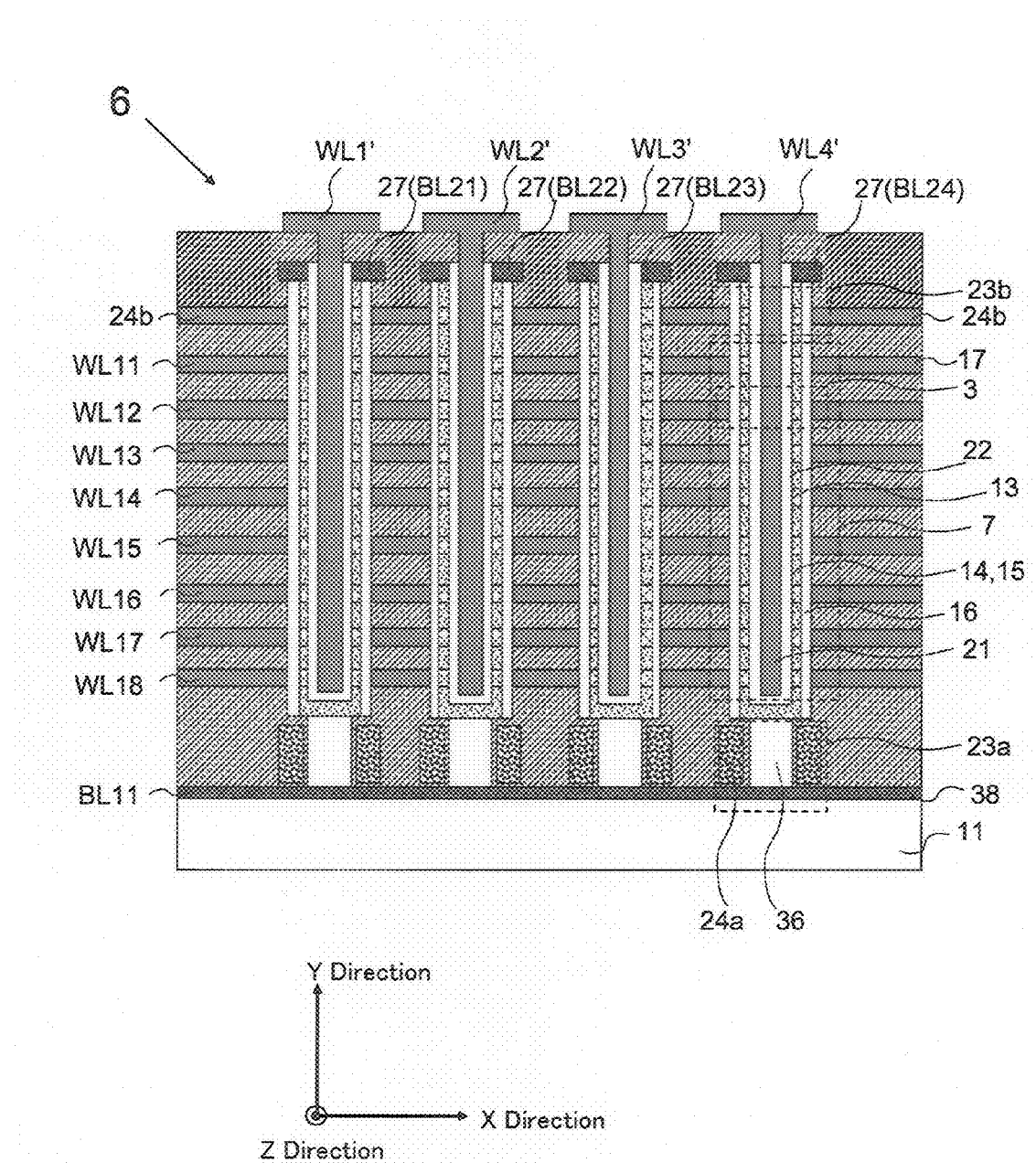
FIG. 24 is a structure cross-sectional view of a memory cell array according to a fifth embodiment of the present invention.

FIG. 24 shows an example showing a three-dimensional NAND memory cell array according to the present invention. A memory cell array 6 shown in FIG. 24 is configured in such a manner that a memory cell column 7 is formed by connecting the plurality of (8 in this example) elements 3 of the present invention described in the third embodiment, in series in a direction perpendicular to the substrate (column direction, that is, Y direction in the drawing) to constitute the NAND memory cell array. The annular metal oxide films 13 to 15 may be made of the metal oxide having the perovskite structure such as PCMO ($Pr_{1-X}Ca_XMnO_3$).

The three-dimensional memory cell array is formed by arranging the memory cell columns 7 in a row direction (X direction in the drawing) and a third direction (Z direction in the drawing). The select transistors 23a and 23b are arranged on both ends of the memory cell column, respectively. While the select transistor 23b has the same structure as that of the element 3 of the present invention, it is used as the transistor to select the target memory cell column for the reading or writing operation under the condition that the resistance state of the metal oxide film 13 serving as the variable resistor is fixed to the high resistance state. Meanwhile, the select transistor 23a is a column-shaped vertical transistor formed on the Si substrate 11, and its gate electrode 24a made of polycrystalline Si is formed to surround a channel layer 36. The channel layer 36 is in contact with the metal oxide film 14, in its upper part, and connected to an impurity layer 38 extending in the row direction (X direction in the drawing) on the substrate 11, in its lower part, and the impurity layer 38 serves as the first bit line BL11 and is connected to the select transistor 23a arranged in the same position in the third direction (Z direction in the drawing). The metal wiring 27 is connected to each select transistors 23b arranged in the same position in the row direction (X direction in the drawing), and thus, second bit lines BL21 to BL24 are formed to extend in the third direction (Z direction in the drawing).

The gate electrodes 17 of the elements 3 of the present invention arranged in the same position in the column direction (Y direction in the drawing) are connected to plate-shaped word lines WL11 to WL18, and a through hole is filled with the second gate electrode 21. Meanwhile, the second gate electrodes 21 of the memory cell column arranged in the same position in the row direction (X direction in the drawing) are connected to the common second word lines WL1' to WL4' extending in the third direction (Z direction in the drawing). In addition, while the word lines WL11 to WL18 are formed into the plate shape in this embodiment, linear word lines may be configured in such a manner that they are separated in the third direction (Z direction in the drawing), and extend in the row direction (X direction in the drawing).

Similar to the fourth embodiment, the above memory cell array is configured such that the word line and the second word line are selected, a voltage not lower than the threshold value is applied between the gate electrode and the second gate electrode of the selected element 3 of the present invention, and oxygen is moved between the insulation film 16 and the metal oxide film 13 serving as the variable resistor by an induced electric field, whereby the resistance state of the selected element 3 of the present invention can be written. Meanwhile, the resistance state can be read by detecting a current value flowing between the first bit line and the second bit line.

In addition, the above embodiment is one example of the third-dimensional memory cell array structure, and the present invention is not limited to the above configuration. As the three-dimensional memory cell array structure, various kinds of well-known configurations in other NAND flash memories are available.

As described above, in the case of the memory cell array of the present invention, unlike a conventional two-terminal element, since the transistor type elements are arranged in the cross point type memory cell array having the 1R structure, a direction of the electric field in programming and a direction of a reading current can be perpendicularly separated, which implements a low programming current and a certain level or more of the reading current at the same time. Furthermore, the writing operation can be performed at low voltage and at high speed as compared with the flash memory. Furthermore, since the resistance change of the strongly-correlated material is used, the size can be miniaturized to be far smaller than a usual semiconductor element. Therefore, the memory can implement high performance, large capacity, and low cost.

Other Embodiments

Hereinafter other embodiments of the present invention will be described.

(1) In the above embodiments, PCMO ($Pr_{1-X}Ca_XMnO_3$) or $Sm_{1-X}Ca_XMnO_3$ is used as the oxide film having the perovskite structure in which resistance is changed depending on the oxygen concentration in the film, but the present invention is not limited to this configuration. As a conductive oxide having the perovskite structure expressed by a chemical formula "$ABO_3$", $Pr_{1-X}Ca_X[Mn_{1-Z}M_Z]O_3$ in which a part of Mn of B site of the PCMO is replaced with a transition metal element M such as Ta, Ti, Cu, Cr, Co, Fe, Ni, or Ga may be used, $La_{1-X}AE_XMnO_3$ in which a part of La of A site of $LaMnO_3$ (LMO) is replaced with dyad alkali earth metal RE such as Ca, Sr, Pb, or Ba may be used, or $RE_{1-X}Sr_XMnO_3$ in which a part of a rare earth RE of A site is replaced with Sr, in an oxide of a triad rare earth RE such as Sm, La, Pr, Nd, Gd, or Dy, and Mn may be used. In addition, $La_{1-X}Co_X[Mn_{1-Z}Co_Z]O_3$ in which a part of La of A site and a part of Mn of B site of the LMO is replaced with Co may be used. As another example, $Gd_{1-X}Ca_XMnO_3$ in which a part of Gd of $GdMnO_3$ is replaced with Ca, or $Nd_{1-X}Gd_XMnO_3$ in which a part of Nd of $NdMnO_3$ is replaced with Gd may be used.

While these materials present the phenomenon in which the electric resistance changes when a voltage pulse is applied, among them, it is preferable for a variable resistor of the present invention that the material of $Pr_{1-X}Ca_XMnO_3$ (PCMO) is used because a change in resistance value is large, and a composition is provided such that X is about 0.3.

(2) While the memory cell array 5 is formed such that the four memory cell columns 4 each provided by connecting the eight elements 2 of the present invention in the column direction in series are arranged in the row direction in the fourth embodiment, the present invention is not limited to this. The present invention is not limited by the number of the variable resistive elements connected in series in the memory cell column, and not limited to the number of the memory cell columns arranged in the row direction. However, the number of the element 2 of the present invention connected in series in the memory cell column, and the number of the memory cell columns 4 arranged in the row direction are each preferably the integral multiple of the bite (8, 16, 32, or 64).

In addition, a further large-capacity memory cell array can be formed by arranging the memory cell columns in the row direction and column direction also. In this case, the second gate electrodes of the elements 2 of the present invention in the memory cell columns arranged in the same position in the row direction (that is, they belong to the same column) are to be connected to the same second word line.

Figure 25:
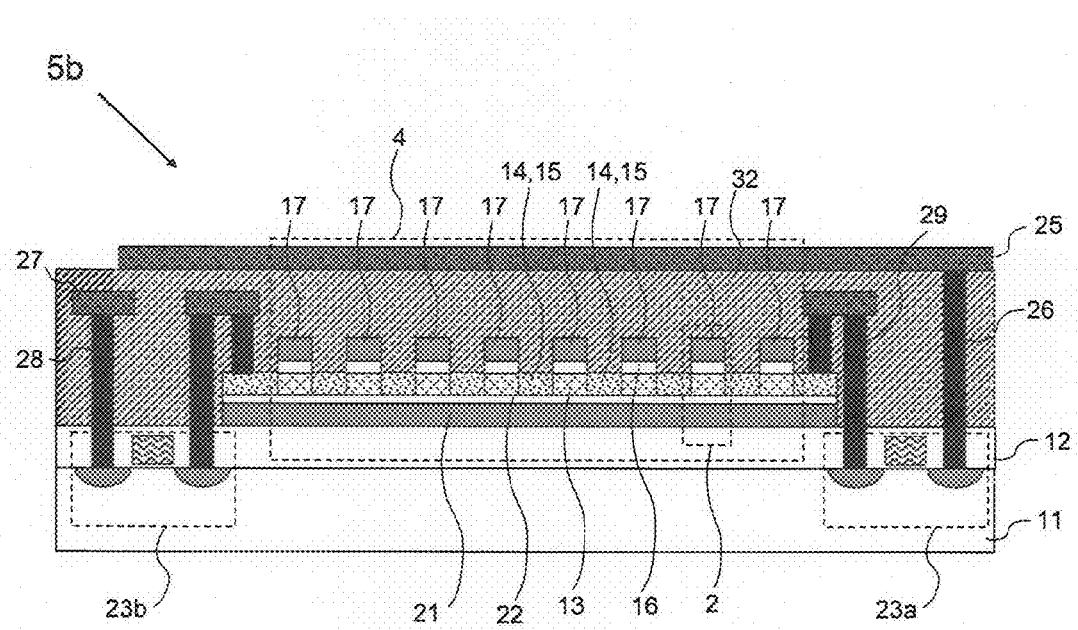
FIG. 25 is a structure cross-sectional view of a memory cell array when a select transistor is composed of a MOS transistor in the memory cell array according to the fourth embodiment of the present invention.

(3) While each of the select transistors 23a and 23b connected to the memory cell column 4 is composed of the nonvolatile variable resistive element 2 of the present invention in the fourth embodiment, and the one 23b of the two select transistors connected to the memory cell column 7 is composed of the nonvolatile variable resistive element 3 in the fifth embodiment, an MOS transistor formed on the Si substrate may be used as the select transistors 23a and 23b. In a memory cell array 5b shown in FIG. 25, MOS transistors 23a and 23b formed on the substrate 11 are connected to the upper memory cell column 4 formed on the insulation film 12, through a through hole 29, thereby constituting a memory cell array having the NAND structure.

Since the above memory cell array 5b is large in element appropriative area, it has a demerit in view of cost, but it is superior in switching characteristic and uniformity as the select transistor, and the demerit can be improved by increasing the number of the memory cells connected in series such as 32 or 64.

(4) While in the memory cell array 5 according to the fourth embodiment, the second gate electrodes 21 of the elements 2 of the present invention are connected to the common second word line with respect to each column, the present invention is not limited to this configuration. The second gate electrodes in the memory cell columns 4 in the same row can be connected to the common second word line.

Figure 26A:
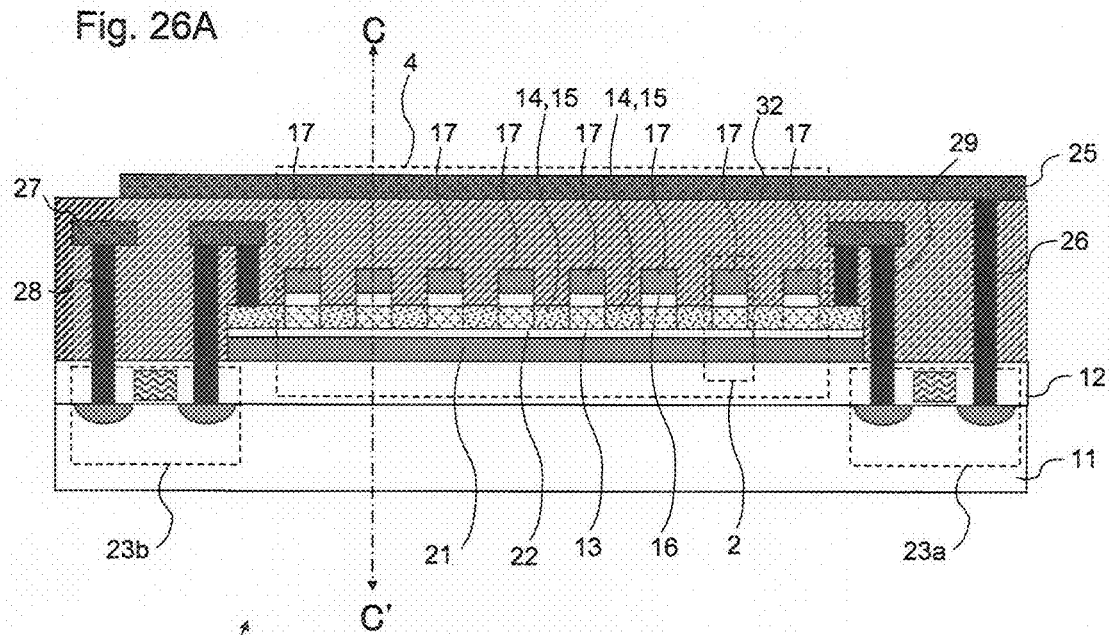
FIGS. 26A and 26B are structure cross-sectional views of a memory cell array according to another embodiment of the present invention.
Figure 26B:
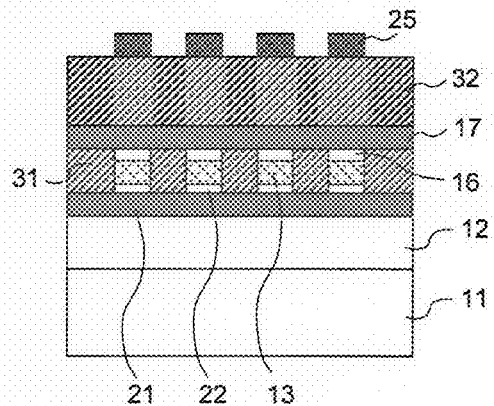
Figure 27:
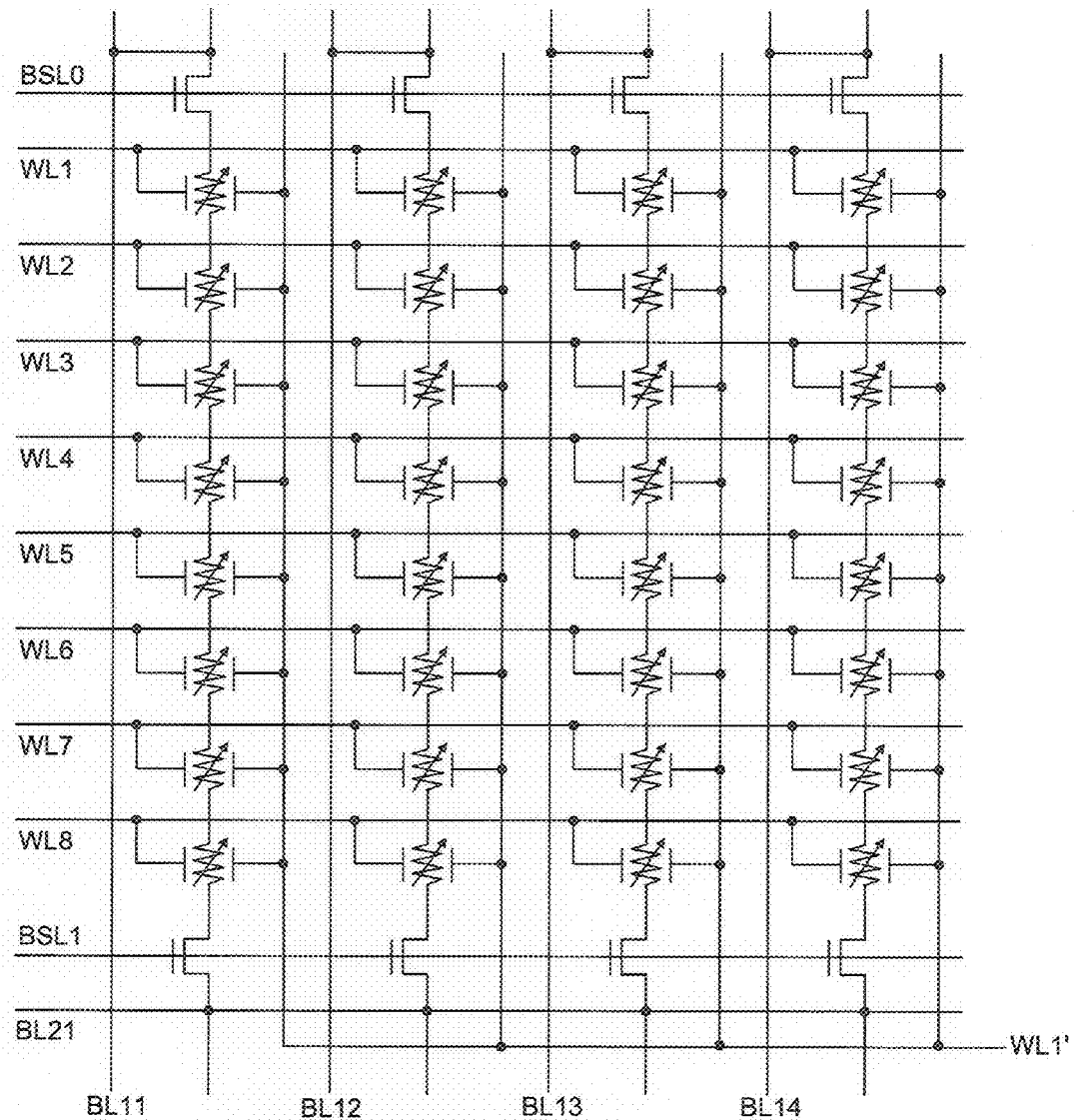
FIG. 27 is an equivalent circuit diagram of the memory cell array according to the other embodiment of the present invention.

As shown in a cross-sectional view in FIG. 26A, a memory cell array 5c is formed such that the memory cell columns 4 are arranged in the row direction on the Si substrate 11 having MOS transistors 23a and 23b serving as select transistors, with the insulation film 12 interposed therebetween. FIG. 26B shows a cross-sectional view taken along a line C-C' in FIG. 26A. FIG. 27 shows an equivalent circuit diagram of the memory cell array 5c. While the second gate electrode 21 is perpendicular to the word line and extends in the column direction in the fourth embodiment, one continuous plate shape is provided in a block in this embodiment. Thus, the second gate electrodes in the memory cell columns 4 in the same row are all connected to the common second word line WL1'. That is, the memory cell array 5c is a simplified memory cell array having the NAND structure compared with the memory cell array 5.

In the above configuration, since the second word line WL1' is shared by the all elements 2 of the present invention in the block, the memory cell cannot be selected in the programming and erasing operations per cell unlike in the fourth embodiment. Instead, the programming can be performed by applying a voltage from the first bit line or the second bit line.

Figure 28:
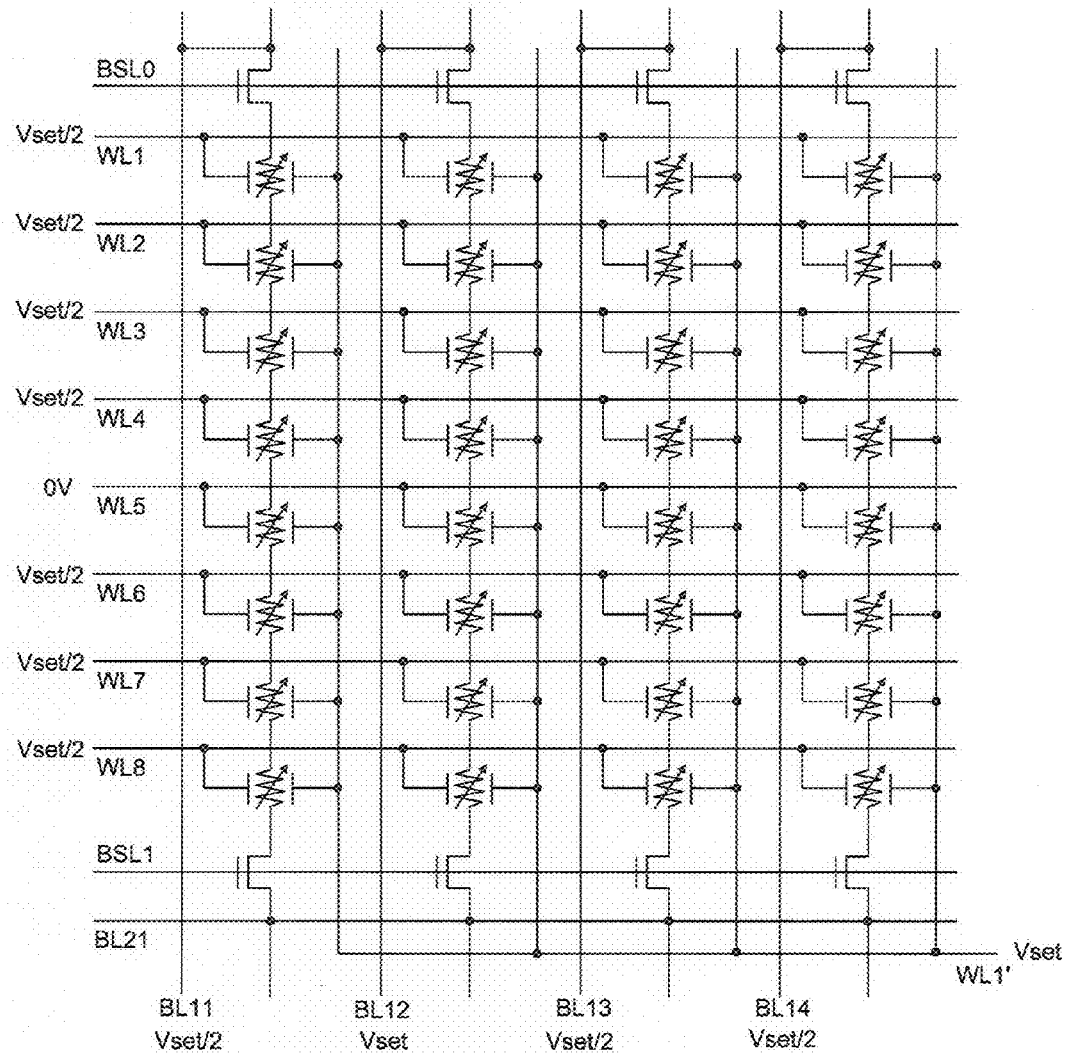
FIG. 28 is a view showing a voltage applied condition in a programming operation of the memory cell array according to the other embodiment of the present invention.

FIG. 28 shows an example of a voltage applied condition in the programming operation of the memory cell array 5c. Here, it is assumed that the memory cell connected to the word line WL5 and the first bit line BL12 is selected as a programming target. A voltage is applied to the BSL0 and BSL1 to turn on the select transistor 23a connected to the selected element 2 of the present invention, and a voltage Vset is applied to the first bit line BL12 connected to the memory cell column to which the selected elements 2 of the present invention belong, and a voltage Vset/2 is applied to the other unselected first bit lines BL11, BL13, and BL14. Meanwhile, the select transistor 23b connected to the selected element 2 of the present invention is turned off. In addition, the voltage Vset/2 is applied to the word lines (WL1 to WL4 and WL6 to WL8) corresponding to the unselected rows in the memory cell array, and 0 V is applied to the selected word line WL5. The voltage Vset is applied to the second word line WL1'.

In this case, the voltage Vset/2 is applied to the source and drain regions at both ends of the element 2 of the present invention in the memory cell column connected to any one of the unselected first bit line BL11, BL13, or BL14, from the unselected first bit line, and the voltage Vset is applied to the source and drain regions on both ends of the element 2 of the present invention in the memory cell column connected to the selected first bit line BL12, from the selected first bit line BL12. Here, the voltage Vset is not lower than the threshold voltage to cause the resistance change in the metal oxide film serving as the variable resistor from the high resistance state to the low resistance state, and the voltage Vset/2 is lower than the threshold voltage. Thus, in the element 2 of the present invention positioned at an intersection of the selected first bit line BL12 and the selected word line WL5, oxygen in the insulation film 16 is moved toward the metal oxide film 13 by the electric field, and the resistance of the selected element 2 of the present invention is lowered. While the voltage Vset/2 is applied to the gate electrode and the voltage Vset is applied to the second gate electrode in the memory cell connected to the unselected word line, the resistance state of the element 2 of the present invention does not change because the voltage is lower than the threshold voltage to lower the resistance state. Although 0 V is applied to the gate electrode and the voltage Vset is applied to the second gate electrode in the memory cell positioned at the intersection of the selected word line and the unselected bit line, the element is kept in the low-resistance conduction state because the Vset/2 is applied from the unselected bit line, so that the potential just under the gate electrode becomes Vset/2, and an electric field required for the programming is not induced and the resistance state does not change.

An erasing operation (batch erasing operation) and a reading operation are performed by the same method as those in the fourth embodiment. In addition, a method for producing the memory cell array 5c is provided such that the step of processing the metal film 19 to the metal film 21 by etching in FIG. 17B according to the fourth embodiment is to be replaced with a step of processing the metal film 19 to the metal film 22 by etching so as to leave the metal film 21 on the whole surface.

(5) While the configuration of the memory cell array 5 in the fourth embodiment is provided such that each memory cell has the two select transistors, and connected to the first bit line extending in the row direction and the second bit line extending in the row direction, the present invention is not limited to this configuration.

Figure 29:
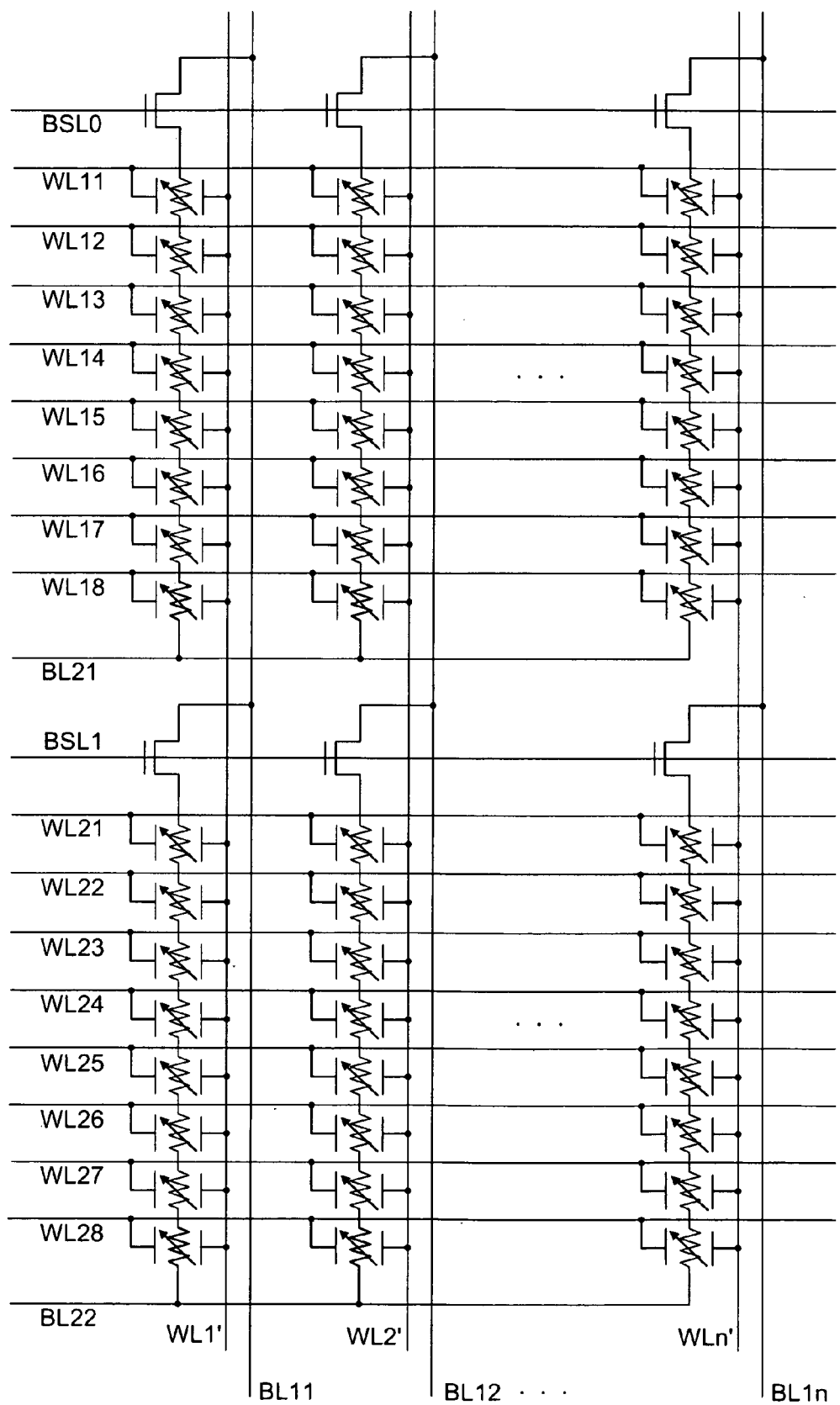
FIG. 29 is an equivalent circuit diagram of a memory cell array according to another embodiment of the present invention.

In a case of a memory cell array 5d shown in an equivalent circuit diagram shown in FIG. 29, while each memory cell column has a select transistor to connect one end of the memory cell column to any one of the first bit lines BL11 to BL1n extending in the column direction, the other end of the memory cell column is directly connected to any one of the second bit line BL21 and BL22 extending in the row direction.

Figure 30:
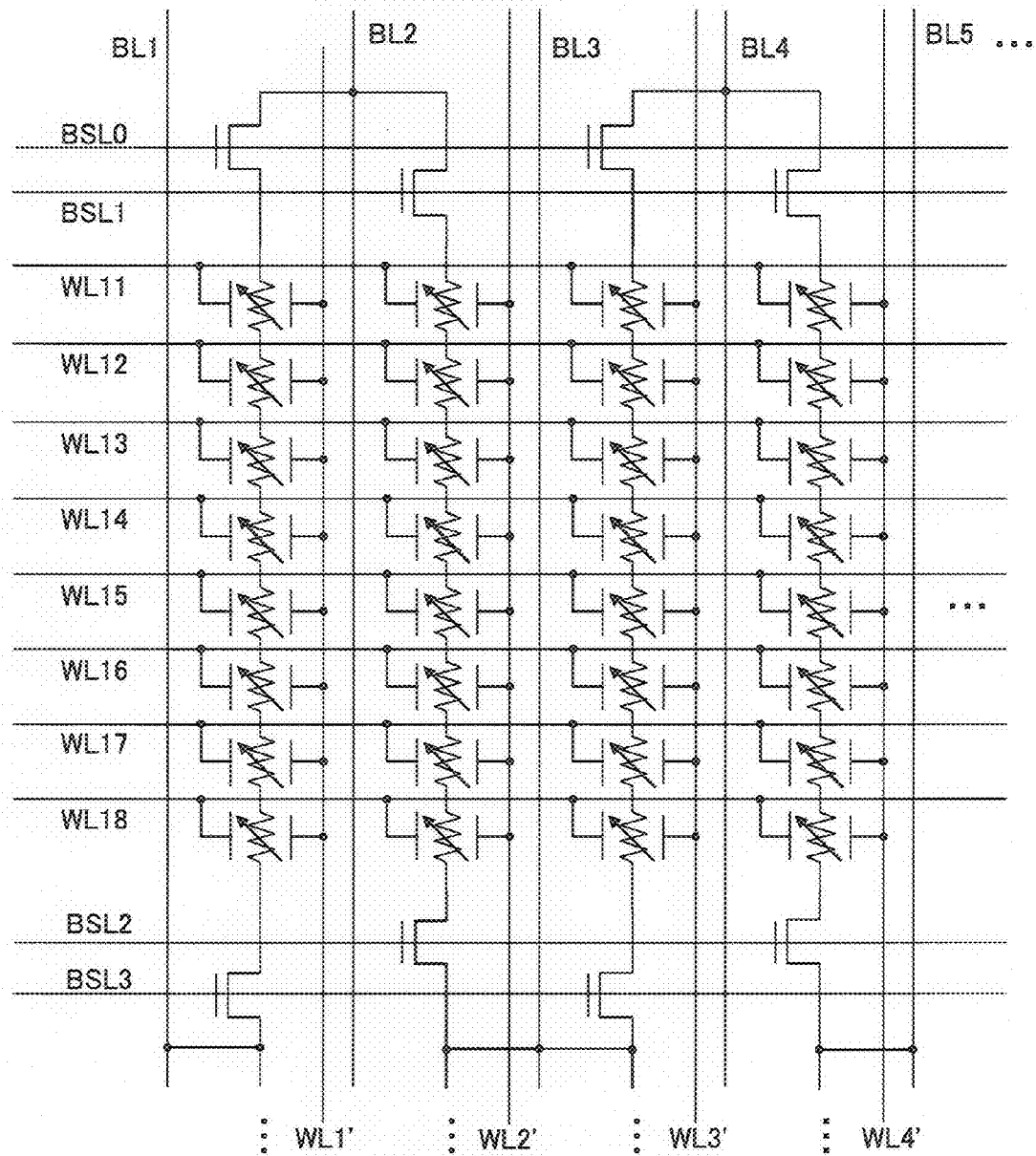
FIG. 30 is an equivalent circuit diagram of a memory cell array according to another embodiment of the present invention.

In a case of a memory cell array 5e shown in an equivalent circuit diagram shown in FIG. 30, first bit lines and second bit lines (BL1 to BL5) both extend in the column direction, and the first bit line of the memory cell column belonging to the odd-number columns and the second bit line of the memory cell columns belonging to the even-number columns share the same bit line, and the first bit line of the memory cell column belonging to the even-number columns and the second bit line of the memory cell column belonging to the odd-number columns share the same bit line.

Figure 31:
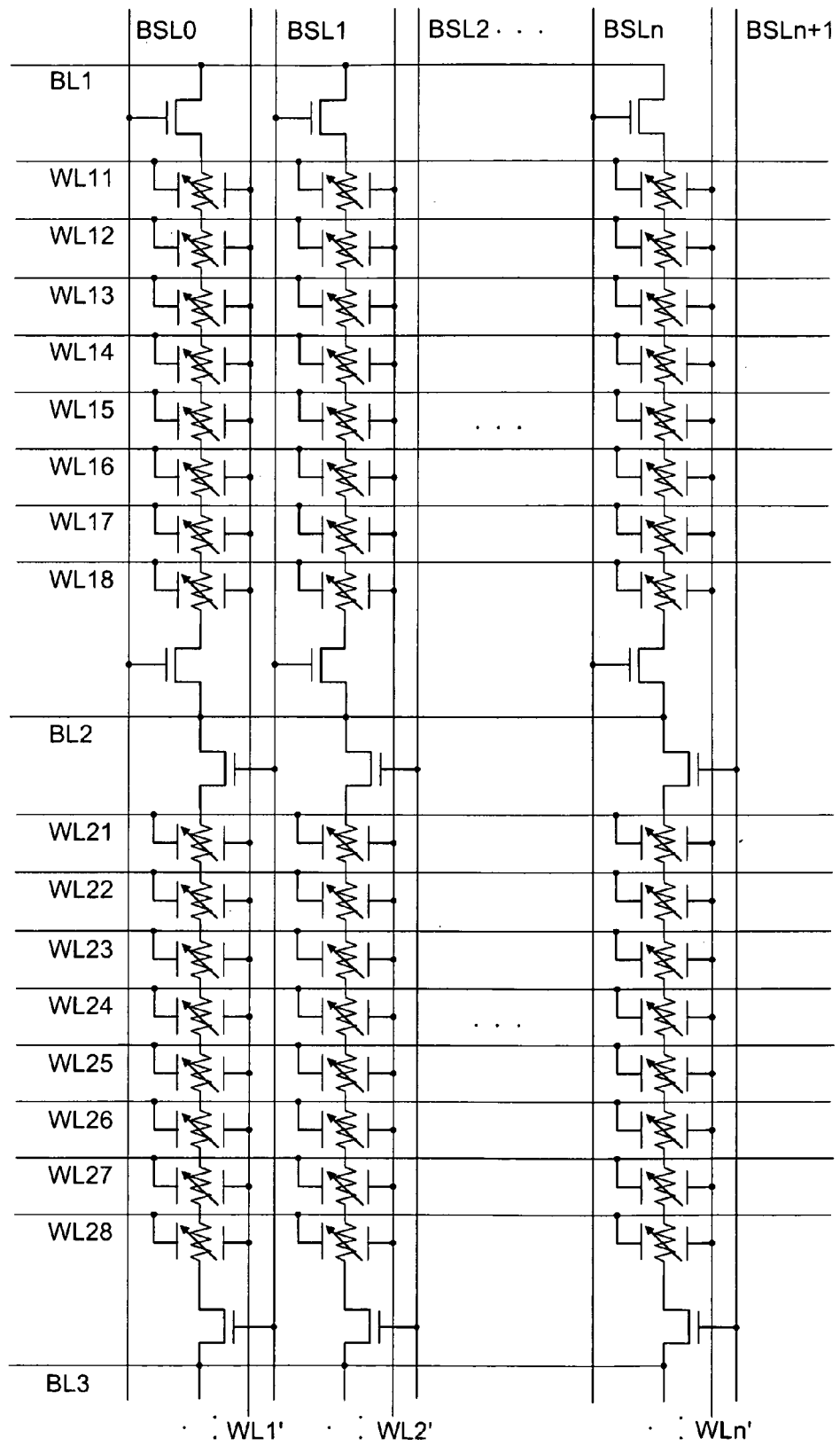
FIG. 31 is an equivalent circuit diagram of a memory cell array according to another embodiment of the present invention.

In a case of a memory cell array 5f shown in an equivalent circuit diagram shown in FIG. 31, first bit lines and second bit lines (BL1 to BL3) both extend in the row direction, and bit select lines BSL0 to BSLn+1 extend in the column direction. The first bit line of the memory cell column belonging to the odd-number rows and the second bit line of the memory cell columns belonging to the even-number rows share the same bit line, and the first bit line of the memory cell column belonging to the even-number rows and the second bit line of the memory cell column belonging to the odd-number rows share the same bit line.

The present invention can be used in a nonvolatile semiconductor memory device and especially, used in a nonvolatile semiconductor memory device including a nonvolatile variable resistive element in which a resistance state is changed by voltage application and the resistance state after changed is held in a nonvolatile manner.

Although the present invention has been described in terms of a preferred embodiment, it will be appreciated that various modifications and alterations might be made by those skilled in the art without departing from the invention. The invention should therefore be measured in terms of the claims which follow.

What is claimed is:
1. A nonvolatile variable resistive element comprising:
a variable resistor composed of a metal oxide film to cause a resistance change according to an oxygen concentration in the metal oxide film;
an insulation film formed on the variable resistor;
a first electrode and a second electrode having contact with the variable resistor and being apart from each other in a direction parallel to an interface between the insulation film and the variable resistor; and
a third electrode being opposite to the variable resistor in a direction perpendicular to the interface across the insulation film, over a path of a current flowing between the first and second electrodes through the variable resistor, wherein
oxygen is reversibly moved between the variable resistor and the insulation film through the interface by an electric field having an element in the direction perpendicular to the interface when a voltage is applied to the third electrode, and a resistance characteristic of the variable resistor transits between two or more different resistance states and one resistance state after the transition is held in a nonvolatile manner,
a current flows between the first and second electrodes based on the resistance characteristic according to the resistance state of the variable resistor when a voltage is applied between the first and second electrodes, and
the resistance characteristic according to the resistance state of the variable resistor held in the nonvolatile manner is temporarily lowered in resistance when the voltage is applied between the first and second electrodes under a condition that the voltage is applied to the third electrode.

2. The nonvolatile variable resistive element according to claim 1, wherein the first and second electrodes are composed of the same metal oxide film as that of the variable resistor, and oxygen concentrations thereof are fixed to an oxygen concentration at which the resistance characteristic is in a lowest resistance state among the resistance states of the variable resistor.

3. The nonvolatile variable resistive element according to claim 1, wherein a change in resistance characteristic of the variable resistor due to the movement of oxygen between the variable resistor and the insulation film through the interface is generated in an entire film thickness of the variable resistor in a direction perpendicular to the interface.

4. The nonvolatile variable resistive element according to claim 1, wherein the metal oxide film includes a metal oxide having a perovskite structure.

5. The nonvolatile variable resistive element according to claim 4, wherein the metal oxide film includes an oxide having a perovskite structure expressed by any one general formula ($0 \leq X \leq 1$, $0 \leq Z < 1$) among $Pr_{1-X}Ca_X[Mn_{1-Z}M_Z]O_3$ (wherein M is an element selected from Ta, Ti, Cu, Cr, Co, Fe, Ni, and Ga), $Sm_{1-X}Ca_XMnO_3$, $La_{1-X}AE_XMnO_3$ (wherein AE is dyad alkali earth metal selected from Ca, Sr, Pb, and Ba), $RE_{1-X}Sr_XMnO_3$ (wherein RE is triad rare earth selected from Sm, La, Pr, Nd, Gd, and Dy), $La_{1-X}Co_X[Mn_{1-Z}Co_Z]O_3$, $Gd_{1-X}Ca_XMnO_3$, and $Nd_{1-X}Gd_XMnO_3$.

6. The nonvolatile variable resistive element according to claim 1, comprising:

a second insulation film opposite to the insulation film across the variable resistor in a direction perpendicular to the interface; and a fourth electrode opposite to the third electrode across the insulation film, the variable resistor, and the second insulation film in the direction perpendicular to the interface, wherein when a voltage not lower than a threshold value is applied between the third electrode and the fourth electrode, the resistance characteristic of the variable resistor transits between two or more different resistance states by an electric field having an element in the direction perpendicular to the interface.

7. The nonvolatile variable resistive element according to claim 6, wherein the second insulation film is made of a material that does not cause reversible oxygen movement between the variable resistor and the second insulation film through an interface between the variable resistor and the second insulation film even when a voltage required to reversibly move oxygen between the variable resistor and the insulation film through the interface, and to transit the resistance characteristic of the variable resistor is applied between the third electrode and the fourth electrode.

8. The nonvolatile variable resistive element according to claim 6, wherein the variable resistor has an annular shape, the first electrode and the second electrode are in contact with an upper surface and a lower surface of the annular variable resistor, respectively, and the third electrode is in contact with an outer side wall surface of the annular variable resistor with the insulation film having an annular shape interposed therebetween, and the fourth electrode is in contact with an inner side wall surface of the annular variable resistor with the second insulation film having an annular shape interposed therebetween.

9. The nonvolatile variable resistive element according to claim 6, wherein the first and second electrodes are composed of the same metal oxide film as that of the variable resistor, and oxygen concentrations thereof are fixed to an oxygen concentration at which the resistance characteristic is in a lowest resistance state among the resistance states of the variable resistor.

10. The nonvolatile variable resistive element according to claim 6, wherein a change in resistance characteristic of the variable resistor due to the movement of oxygen between the variable resistor and the insulation film through the interface is generated in an entire film thickness of the variable resistor in a direction perpendicular to the interface.

11. The nonvolatile variable resistive element according to claim 6, wherein the metal oxide film includes a metal oxide having a perovskite structure.

12. The nonvolatile variable resistive element according to claim 11, wherein the metal oxide film includes an oxide having a perovskite structure expressed by any one general formula ($0 \leq X \leq 1$, $0 \leq Z < 1$) among $Pr_{1-X}Ca_X[Mn_{1-Z}M_Z]O_3$ (wherein M is an element selected from Ta, Ti, Cu, Cr, Co, Fe, Ni, and Ga), $Sm_{1-X}Ca_XMnO_3$, $La_{1-X}AE_XMnO_3$ (wherein AE is dyad alkali earth metal selected from Ca, Sr, Pb, and Ba), $RE_{1-X}Sr_XMnO_3$ (wherein RE is triad rare earth selected from Sm, La, Pr, Nd, Gd, and Dy), $La_{1-X}Co_X[Mn_{1-Z}Co_Z]O_3$, $Gd_{1-X}Ca_XMnO_3$, and $Nd_{1-X}Gd_XMnO_3$.

13. A nonvolatile semiconductor memory device comprising:

a memory cell column provided by connecting the nonvolatile variable resistive elements according to claim 1 in series in a column direction, wherein the memory cell column is provided in such a manner that the first electrode of the one of the adjacent nonvolatile variable resistive elements is connected to the second electrode of the other nonvolatile variable resistive element, with respect to each nonvolatile variable resistive element in the memory cell column, a first select transistor having a pair of input and output terminals, and a control terminal to control a current flowing between the pair of input and output terminals is provided with respect to each memory cell column, and the first electrode positioned at one end of the memory cell column is connected to one end of the pair of input and output terminals of the first select transistor.

14. The nonvolatile semiconductor memory device according to claim 13, wherein the memory cell column is provided in such a manner that a second select transistor having a pair of input and output terminals and a control terminal to control a current flowing between the pair of input and output terminals is provided with respect to each memory cell column, and the second electrode positioned at the other end of the memory cell column is connected to one end of the pair of input and output terminals of the second select transistor.

15. The nonvolatile semiconductor memory device according to claim 14, wherein
the memory cell columns are arranged in at least a row direction, so that the nonvolatile variable resistive elements are arranged in a matrix shape in the row direction and the column direction,
the first electrodes positioned at the one ends of the memory cell columns in the same row or the same column are connected to a common first bit line through the first select transistor,
the second electrodes positioned at the other ends of the memory cell columns in the same row or the same column are connected to a common second bit line through the second select transistor, and
the third electrodes of the nonvolatile variable resistive elements in the same row are connected to a word line extending in the row direction.

16. A nonvolatile semiconductor memory device comprising:
a memory cell column provided by connecting the nonvolatile variable resistive elements according to claim 6 in series in a column direction, wherein
the memory cell column is provided in such a manner that
the first electrode of the one of the adjacent nonvolatile variable resistive elements is connected to the second electrode of the other nonvolatile variable resistive element, with respect to each nonvolatile variable resistive element in the memory cell column,
a first select transistor having a pair of input and output terminals, and a control terminal to control a current flowing between the pair of input and output terminals is provided with respect to each memory cell column,
the first electrode positioned at one end of the memory cell column is connected to one end of the pair of input and output terminals of the first select transistor,
the memory cell columns are arranged in at least a row direction, so that the nonvolatile variable resistive elements are arranged in a matrix shape in the row direction and the column direction,
the first electrodes positioned at the one ends of the memory cell columns in the same row or the same column are connected to a common first bit line through the first select transistor,
the second electrodes positioned at the other ends of the memory cell columns in the same row or the same column are connected to a common second bit line directly or through a second select transistor,
the third electrodes of the nonvolatile variable resistive elements in the same row are connected to a word line extending in the row direction, and
the fourth electrodes of the nonvolatile variable resistive elements in the memory cell column are connected to a common second word line.

17. The nonvolatile semiconductor memory device according to claim 16, wherein
the fourth electrodes of the nonvolatile variable resistive elements in the memory cell columns in the same column are connected to the common second word line.

18. The nonvolatile semiconductor memory device according to claim 17, wherein
the fourth electrodes of the nonvolatile variable resistive elements in the memory cell columns in the same row are connected to the common second word line.

19. The nonvolatile semiconductor memory device according to claim 13, wherein
the memory cell columns are arranged in three-dimensional manner in the row direction, the column direction, and a third direction perpendicular to the row direction and the column direction.

20. The nonvolatile semiconductor memory device according to claim 16, wherein
the memory cell columns are arranged in three-dimensional manner in the row direction, the column direction, and a third direction perpendicular to the row direction and the column direction.

21. The nonvolatile semiconductor memory device according to claim 13, comprising:
the memory cell column provided by connecting the nonvolatile variable resistive elements in series in the column direction perpendicular to a substrate, wherein
the memory cell columns are arranged in a row direction, and a third direction perpendicular to the row direction and the column direction, so that the nonvolatile variable resistive elements are arranged in a form of a three-dimensional matrix in the row direction, the column direction, and the third direction,
the first electrodes positioned at one ends of the memory cell columns arranged in the same position in the third direction are connected to a common first bit line through the first select transistor,
the second electrodes positioned at the other ends of the memory cell columns arranged in the same position in the row direction are connected to a common second bit line directly or through a second select transistor, and
the third electrodes of the nonvolatile variable resistive elements arranged in the same positions in the column direction are connected to a common word line.

* * * * *